US009059666B2

(12) United States Patent
Matsumoto et al.

(10) Patent No.: US 9,059,666 B2
(45) Date of Patent: Jun. 16, 2015

(54) SYSTEMS AND METHODS FOR BIASING AMPLIFIERS DURING HIGH-POWER OPERATION WITH ADAPTIVE CLOSED-LOOP CONTROL

(71) Applicant: Aviat U.S., Inc., Santa Clara, CA (US)

(72) Inventors: Frank Matsumoto, San Ramon, CA (US); Youming Qin, Sunnyvale, CA (US); Andres Goytia, Santa Clara, CA (US); Cuong Nguyen, San Jose, CA (US)

(73) Assignee: Aviat U.S., Inc., Santa Clara, CA (US)

( * ) Notice: Subject to any disclaimer, the term of this patent is extended or adjusted under 35 U.S.C. 154(b) by 0 days.

(21) Appl. No.: 14/184,282

(22) Filed: Feb. 19, 2014

(65) Prior Publication Data
US 2014/0191808 A1 Jul. 10, 2014

Related U.S. Application Data

(63) Continuation-in-part of application No. 14/150,721, filed on Jan. 8, 2014.

(60) Provisional application No. 61/767,208, filed on Feb. 20, 2013, provisional application No. 61/750,308, filed on Jan. 8, 2013.

(51) Int. Cl.
*H03F 3/21* (2006.01)
(52) U.S. Cl.
CPC ........................................ *H03F 3/21* (2013.01)
(58) Field of Classification Search
USPC .......... 330/296–297, 285, 279, 127, 129, 134
See application file for complete search history.

(56) References Cited

U.S. PATENT DOCUMENTS

| | | | |
|---|---|---|---|
| 4,463,272 A | 7/1984 | Tucker | |
| 4,924,191 A | 5/1990 | Erb et al. | |
| 5,426,641 A | 6/1995 | Afrashteh et al. | |
| 5,451,907 A | 9/1995 | Keane et al. | |
| 5,886,575 A * | 3/1999 | Long | 330/129 |
| 6,043,706 A | 3/2000 | Nowak et al. | |
| 6,178,313 B1 | 1/2001 | Mages et al. | |
| 6,304,145 B1 | 10/2001 | Laureanti et al. | |

(Continued)

FOREIGN PATENT DOCUMENTS

GB 2401264 11/2004

OTHER PUBLICATIONS

International Application No. PCT/US2014/017190, International Search Report and Written Opinion mailed May 30, 2014.

(Continued)

*Primary Examiner* — Hieu Nguyen
(74) *Attorney, Agent, or Firm* — Sheppard, Mullin, Richter & Hampton LLP

(57) ABSTRACT

Various embodiments described herein provide systems and methods for improved performance for power amplifiers, particularly GaN power amplifiers. According to some embodiments, a power amplifier (e.g., GaN power amplifier) utilizes an adaptive closed-loop control of the drain current of the power amplifier to achieve improved performance for the power amplifier. Additionally, for some embodiments, use of the adaptive closed-loop control of the drain current of the power amplifier depends on the power region in which the power amplifier is operating (e.g., depends on the radio frequency power region).

27 Claims, 12 Drawing Sheets

(56) References Cited

U.S. PATENT DOCUMENTS

| | | |
|---|---|---|
| 6,351,189 B1 | 2/2002 | Hirvilampi |
| 6,424,211 B1 | 7/2002 | Nolan et al. |
| 6,515,545 B1 | 2/2003 | Hu et al. |
| 6,549,068 B1 | 4/2003 | Bollenbeck |
| 6,603,356 B1 | 8/2003 | Kim et al. |
| 6,614,309 B1 | 9/2003 | Pehlke |
| 7,268,626 B2 | 9/2007 | Anand |
| 8,195,103 B2 | 6/2012 | Waheed et al. |
| 8,295,794 B2 * | 10/2012 | Agarwal ............ 455/127.1 |
| 2003/0160654 A1 | 8/2003 | Fischer et al. |
| 2003/0201834 A1 | 10/2003 | Pehlke |
| 2006/0132230 A1 | 6/2006 | Douglas |
| 2008/0002983 A1 | 1/2008 | Ishikawa et al. |
| 2008/0125061 A1 | 5/2008 | Kuriyama et al. |
| 2010/0151804 A1 | 6/2010 | Song et al. |
| 2011/0221523 A1 | 9/2011 | Dupis et al. |
| 2011/0279185 A1 | 11/2011 | Lautzenhiser |
| 2012/0313709 A1 | 12/2012 | Lautzenhiser |
| 2012/0326778 A1 | 12/2012 | Nadimpalli et al. |
| 2014/0118074 A1 | 5/2014 | Levesque et al. |

OTHER PUBLICATIONS

International Application No. PCT/US2014/010758, International Search Report and Written Opinion mailed May 2, 2014.

International Application No. PCT/US2014/031914, International Search Report and Written Opinion mailed Aug. 11, 2014.

* cited by examiner

SYSTEMS AND METHODS FOR BIASING AMPLIFIERS DURING HIGH-POWER OPERATION WITH ADAPTIVE CLOSED-LOOP CONTROL

CROSS-REFERENCE TO RELATED APPLICATIONS

The present application is a continuation-in-part of U.S. patent application Ser. No. 14/150,721, filed Jan. 8, 2014 and entitled "Systems and Methods for Biasing Amplifiers with Adaptive Closed Loop Control," which claims the benefit of U.S. Provisional Patent Application Ser. No. 61/750,308, filed Jan. 8, 2013 and entitled "System and Method for Biasing GaN Amplifiers with Adaptive Closed Loop Control," each of which is incorporated by reference herein. The present application also claims the benefit of U.S. Provisional Patent Application Ser. No. 61/767,208, filed Feb. 20, 2013 and entitled "Adaptive Bias Control (ABC) of GaN Amplifiers for High Power Operation," which is incorporated by reference herein.

BACKGROUND

1. Technical Field

Some embodiments of the present invention(s) relate to power amplifiers, and more particularly, some embodiments relate to systems and methods for improved power amplifier performance.

2. Description of Related Art

Radio frequency (RF) power amplifiers and devices using Gallium Nitride (GaN) benefit over those using technologies such as gallium arsenide (GaAs). For example, GaN-based power amplifiers have exceptional power density (i.e., increased power per square millimeter of die) and exceptional power efficiency characteristics. Unfortunately, one of the challenges of using GaN-based power amplifiers is controlling the quiescent drain current ($I_q$) of such power amplifiers over time. FIG. 1 provides a chart depicting the drift of the quiescent drain current ($I_{dq}$) of an example GaN power amplifier over time. Such drift impacts certain systems, because as the quiescent drain current ($I_{dq}$) of a GaN power amplifier changes, so does the performance of the GaN power amplifier. One solution to this is a "burn-in" procedure, whereby a GaN power amplifier is energized until the quiescent drain current ($I_{dq}$) of the GaN power amplifier stabilizes. The "burn-in" procedure is time consuming, it is difficult to tell how much time will be required for $I_{dq}$ stabilization in GaN power amplifiers (as it is difficult to predict the drift of the quiescent drain current over long periods of time), and a GaN power amplifier cannot be biased at a constant drain current for its drain current varies according with its RF power output.

Another issue affecting GaN amplifiers relates to their use in non-Class A applications. In particular, it has been observed that the drain current of a GaN amplifier changes dramatically with radio frequency (RF) power level changes when the GaN power amplifier is operating at a power level closer to its power compression point ($P_{sat}$). As a result, when a GaN power amplifier is operating at a power level closer to its $P_{sat}$, control of the drain current of the GaN amplifier with a closed-loop control is difficult, as a small error in the RF power level detected by a radio frequency (RF) power detector results in a large variation of the drain current.

SUMMARY OF EMBODIMENTS

Various embodiments described herein provide systems and methods for improved performance for power amplifiers, particularly GaN power amplifiers. According to some embodiments, a power amplifier (e.g., GaN power amplifier) utilizes adaptive closed-loop control of the drain current of the power amplifier to achieve improved performance for the power amplifier.

According to some embodiments, a system is provided comprising a power amplifier having an input signal, an output signal and a drain current, and a power amplifier operation module. The power amplifier may be a GaN power amplifier. The power amplifier operation module may first determine whether a power amplifier is operating in a low-power mode or a high-power mode (e.g., initial power mode after the power amplifier is powered on). The power amplifier may be operating in the low-power mode when a present power level of the output signal of the power amplifier is less than or equal to a sensitivity power level that designates between the low-power mode and the high-power mode of the power amplifier. The power amplifier may be operating in the high-power mode when a present power level of the output signal of the power amplifier is more than or equal to a sensitivity power level that designates between the low-power mode and the high-power mode of the power amplifier. In this way, the sensitivity power level may serve as a switch-point between the low-power operation and the high-power operation of the power amplifier. For some embodiments, the sensitivity power level is determined during a calibration process of the power amplifier, and once determined, may be stored in a calibration file produced during the calibration process.

If the power amplifier is operating in the high-power mode (e.g., initial power mode after the power amplifier is powered on), the power amplifier operation module may set the power amplifier to operate in the low-power mode, apply a first closed-loop control of the drain current while the power amplifier is operating in the low-power mode, and maintain the drain current (as determined by the first closed-loop control) while adjusting a voltage of the input signal of the power amplifier to reach a desired power level for the output signal of the power amplifier. If the power amplifier is operating in the low-power mode (e.g., initial power mode after the power amplifier is powered on), the power amplifier operation module may apply a second closed-loop control of the drain current according to the desired power level for the output signal of the power amplifier. For some embodiments, the power amplifier operation module determines whether the power amplifier is operating in a low-power mode or a high-power mode after the power amplifier is powered on.

For some embodiments, the power amplifier operation module further determines whether the power amplifier is operating in an Automatic Transmit Power Control (ATPC) mode and, if so, determining whether the power amplifier is operating in the low-power mode or the high-power mode while operating in the ATPC mode. If the power amplifier is operating in the ATPC mode and the high-power mode, the power amplifier operation module may maintain the drain current while adjusting the voltage of the input signal of the power amplifier to reach the desired power level. If the power amplifier is operating in the ATPC mode and the low-power mode, the power amplifier operation module may apply the second closed-loop control of the drain current according to the desired power level for the output signal of the power amplifier.

For some embodiments, adjusting the voltage of the input signal of the power amplifier to reach the desired power level for the power amplifier comprises adjusting a variable voltage attenuator that assists in providing the input signal to the power amplifier. Additionally, for some embodiments, setting the power amplifier to operate in the low-power mode comprises setting the output signal of the power amplifier to a transitory power level that is less than a sensitivity power level. The output signal of the power amplifier may be set to a transitory power level that is less than a sensitivity power level by adjusting a variable-voltage attenuator (VVA) for an input signal to the power amplifier.

In some embodiments, applying the first closed-loop control of the drain current comprises adaptively controlling power of the power amplifier according to a transitory power level, and subsequently, adjusting the drain current based on a calibrated drain current value associated with a present operational parameter of the power amplifier and a present power level of the output signal of the power amplifier after the adaptively controlling power of the power amplifier according to the transitory power level. The calibrated drain current value may be obtained from calibrated drain current data including a set of drain current values associated with a set of operational parameters. The set of drain current values may include a set of quiescent drain current values optimized for the set of operational parameters and a set of non-quiescent drain current values for the set of operational parameters, where the set of non-quiescent drain current values are calibrated for a set of power levels for the output signal of the power amplifier For some embodiments, adaptively controlling the power of the amplifier comprises a proportional-integral-derivative (PID) process for adjusting the power of the amplifier. Additionally, for some embodiments, the present operational parameter is a frequency of the input signal of the power amplifier, a phase of the input signal of the power amplifier, a power level of the input signal of the power amplifier, or a temperature associated with the power amplifier (e.g., temperature of the power amplifier or the ambient temperature around the power amplifier as measured by a temperature sensor). Adjusting the drain current based on the calibrated drain current value may comprise adjusting the drain current of the power amplifier to match or substantially match the calibrated drain current value.

In various embodiments, applying the second closed-loop control of the drain current comprises adaptively controlling power of the power amplifier according to the desired power level, and subsequently, adjusting the drain current based on a calibrated drain current value associated with a present operational parameter of the power amplifier and a present power level of the output signal of the power amplifier after the adaptively controlling power of the power amplifier.

The calibrated drain current data may be stored in a calibration datastore, or file, generated by a calibration process as described herein. For some embodiments, the system may further comprise a power amplifier calibration module configured to generate the calibration drain current data. For example, the power amplifier calibration module may determine an optimized quiescent drain current value for the drain current for a set of operational parameters for the power amplifier. The power amplifier calibration module may also determine a set of calibrated drain current values for the drain current, for a set of operational parameters for the power amplifier, where the set of calibrated drain current values are calibrated for a set of power levels for the output signal of the power amplifier.

According to various embodiments, a system comprises a transmitter or transceiver that includes some or all of the components or functionality described herein. Additionally, some embodiments provide for a method that performs various steps and operations described herein, or provide for a computer program product comprising a computer readable medium having computer program code (i.e., executable instructions) executable by a processor to perform various steps and operations described herein. For example, the systems and methods described herein may be implemented, in whole or in part, as a microcontroller that operates in connection with a power amplifier.

BRIEF DESCRIPTION OF THE DRAWINGS

The drawings are provided for purposes of illustration only and merely depict typical or example embodiments. These drawings are provided to facilitate the reader's understanding and shall not be considered limiting of the breadth, scope, or applicability various embodiments.

Figure 1:
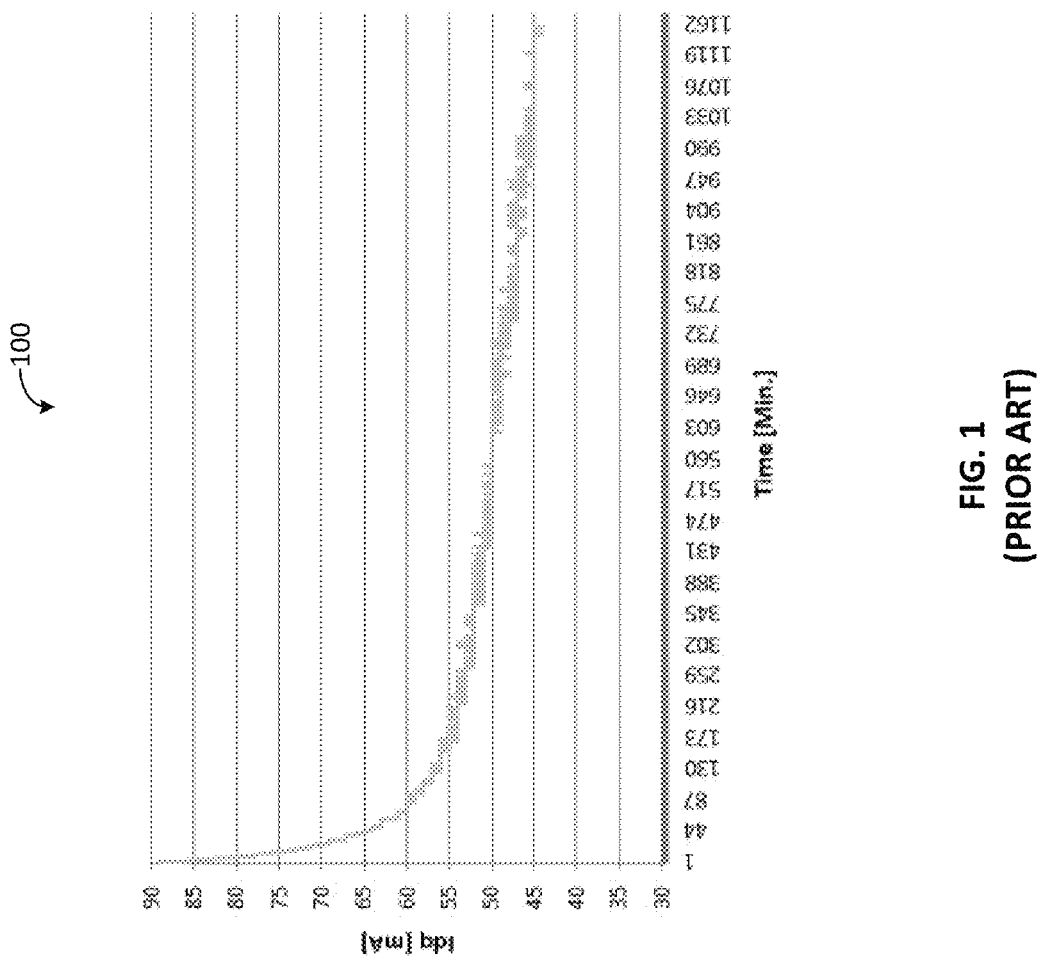
FIG. 1 is a chart depicting a drift of a quiescent drain current ($I_{dq}$) of a power amplifier over time.

The figures are not intended to be exhaustive or to limit the embodiments to the precise form disclosed. It should be understood that various embodiments may be practiced with modification and alteration.

DETAILED DESCRIPTION OF VARIOUS EMBODIMENTS

Various embodiments described herein provide systems and methods for improved performance for power amplifiers, particularly GaN power amplifiers. According to some embodiments, a power amplifier (e.g., GaN power amplifier) utilizes an adaptive closed-loop control of the drain current of the power amplifier to achieve improved performance for the power amplifier. Additionally, for some embodiments, use of the adaptive closed-loop control of the drain current of the power amplifier depends on the power region in which the power amplifier is operating (e.g., depends on the radio frequency power region).

For example, rather than utilizing an adaptive closed-loop control of a drain current of a power amplifier for an entire dynamic range of output power levels (e.g., RF power levels) for the power amplifier, various systems and methods utilize the adaptive closed-loop control for a first sub-range of output power levels where the output power levels are less than a sensitivity power level (e.g., Pout<Psens). For a second sub-range of output power levels where the output power levels are more than or equal to the sensitivity power level (e.g., Pout≥Psens), such systems and methods may maintain the drain current of the power amplifier (e.g., maintain a gate voltage of the power amplifier) while adjusting a power of an input signal (e.g., RF input signal) to the power amplifier to reach a desired power level. The power of the input signal to the power amplifier may be adjusted using a variable-voltage attenuator (VVA), which may be included in the input signal path to the power amplifier.

Depending on the embodiment, the sensitivity power level may be determined during a calibration process of the power amplifier. The determination of the sensitivity power level may be determined as part of the calibration operations described herein. Once determined, the sensitivity power level may be stored in a calibration file produced during the calibration process. For some embodiments, the sensitivity power level is stored with the calibrated drain current data described herein.

In some embodiments, when a power amplifier (e.g., GaN power amplifier) operates at an output power level much lower than its power compression point ($P_{sat}$) and where a drain current of the power amplifier is biased in a non-Class A condition, systems and methods control a drain current of the power amplifier using a closed-loop control. Additionally, in some embodiments, when a power amplifier (e.g., GaN power amplifier) operates at a power level close to its compression point and where a drain current of the power amplifier is biased in a non-Class A condition, systems and methods handle situations where the drain current changes dramatically with radio frequency (RF) power level changes. Such a situation may arise when there is a small error in the RF power level derived from the RF power detector, and the small error results in a large variation of the drain current. Additionally, in such a situation, full control of the drain current of the power amplifier may not be possible with a closed-loop control for an entire radio frequency (RF) power level range.

For some embodiments, during operation, when a power amplifier is turned on (e.g., DC power on) and has an initial radio frequency (RF) power setting lower than a sensitivity power level (e.g., $P_{out\text{-}init} < P_{sens}$), a closed-loop control is applied to the drain current of the power amplifier.

Further, in some embodiments, during operation, when a power amplifier is turned on (e.g., DC power on) and has an initial radio frequency (RF) power setting higher than or equal to a sensitivity power level (e.g., $P_{out\text{-}init} \geq P_{sens}$), the RF power of the power amplifier is reduced to a level below the sensitivity power level (e.g., $P_{out} < P_{sens}$), thereby setting the power amplifier to a low-power mode operation. Next, while in low-power mode operation, the drain current of the power amplifier can be adaptively closed-loop controlled and locked to a target drain current value based on a best quiescent drain current ($I_{dq}$). The target drain current may be one derived during a calibration process described herein, and one that is associated with the present power level or operational parameter (e.g., frequency or temperature) of the power amplifier. Subsequently, after locking the drain current of the power amplifier to the target drain current, the drain current of the power amplifier can be maintained at the target drain current while the power level of the power amplifier is adjusted to a desired power level (e.g., via a variable-voltage attenuator that modifies an input signal provided to the power amplifier).

In some embodiments, when the radio frequency (RF) power of the power amplifier is reduced to a level lower than the sensitivity power level (e.g., $P_{out\text{-}init} < P_{sens}$), a closed-loop control is applied to the drain current of the power amplifier. When the RF power of the power amplifier is reduced to a level higher than or equal to the sensitivity power level (e.g., $P_{out\text{-}init} \geq P_{sens}$), the drain current of the power amplifier may be maintained, and the power level of the of the power amplifier may be adjusted (e.g., via a variable-voltage attenuator that modifies an input signal provided to the power amplifier) to reach a desired power level.

Various embodiments apply to a power amplifier having an input signal, an output signal, and a drain current. The power amplifier may be a GaN power amplifier, which may be operated a power amplifier or a driver amplifier. Various embodiments utilize the observation that the drain current ($I_d$) of a GaN power amplifier varies proportionally to the quiescent drain current ($I_{dq}$) of the GaN power amplifier, particularly when for the GaN amplifier operating lower than its power compression point ($P_{sat}$). A GaN power amplifier may, for instance, operate lower than its power compression point ($P_{sat}$) where the GaN power amplifier is used in linear modulation applications (e.g., 256 QAM modulation). For some embodiments, an adaptive closed-loop control can leverage the proportional variation between the drain current ($I_d$) and the quiescent drain current ($I_{dq}$) and control the GaN power amplifier accordingly, particularly with respect to controlling the quiescent drain current ($I_{dq}$) of the GaN power amplifier.

According to some embodiments, an adaptive closed-loop control is utilized with a power amplifier to control the drain current of the power amplifier during two phases: a calibration phase and an operation phase. During the calibration phase, various embodiments gather and save information (e.g., a datastore or map) regarding drain current values of a power amplifier during quiescent operation and non-quiescent operation, and while the power amplifier is operating under one or more operational parameters (e.g., input frequency, input phase, temperature, output power level, etc.). During the operation phase, various embodiments utilize information saved from the calibration phase to adaptively control the drain current of the power amplifier, during quiescent operation and non-quiescent operation, based on present operational parameters of the power amplifier. In doing so, optimal or near optimal operation can be achieved for applications of the power amplifier, and with predictable behavior of the drain current of the power amplifier.

For various embodiments, dynamic control (e.g., adjustment) of a drain current of a given power amplifier is achieved by dynamically controlling (e.g., adjusting) a bias of the power amplifier. For some embodiments, the power amplifier bias being dynamically controlled is associated with a gate of the given power amplifier (e.g., a gate voltage). Additionally, in some embodiments, controlling a drain current of a given power amplifier comprises measuring the drain current as the bias of the given power amplifier is controlled.

During the calibration phase, a quiescent drain current ($I_{dq}$) of the power amplifier may be optimized for the performance requirements of a particular application of the power amplifier. For example, where a power amplifier is being used in a transmitter, such as a radio frequency unit such as the one depicted and described herein with respect to FIG. 2, the quiescent drain current ($I_{dq}$) of the power amplifier may be optimized for a transmission spectrum that meets regulatory (e.g., FCC) requirements of the transmitter and performance requirements of the transmitter (e.g., amplifying RF signals at microwave frequencies).

Optimizing the quiescent drain current ($I_{dq}$) of the power amplifier may comprise determining one or more quiescent drain current ($I_{dq}$) values for the power amplifier for one or more operational parameters under which the power amplifier may be operated, or is expected to operate, when used in a particular application of the power amplifier (e.g., user of the power amplifier in an radio frequency unit [RFU] transmitter). Examples of operational parameters can include, without limitation, a frequency, phase, or power level of an input signal received by the power amplifier for amplification to an output signal. Other examples of operational parameters can include a power level of the output of the power amplifier (e.g., power level of output signal), a temperature of the power amplifier (e.g., as a whole or of particular components) and a temperature around the power amplifier (e.g., ambient temperature). Examples of operational parameters can also include whether the power amplifier is operating in a quiescent mode (i.e., the power amplifier is drawing quiescent drain current) or non-quiescent mode (i.e., the power amplifier is drawing non-quiescent drain current).

For instance, during calibration of a power amplifier, optimization of a quiescent drain current ($I_{dq}$) of the power amplifier may occur for the permutations of the following operational parameters of the power amplifier: a set of frequencies $F=\{f_1, f_2, f_3, \ldots f_p\}$ expected for the input signals; and a set of power amplifier temperatures $T=\{t_1, t_2, t_3, \ldots t_m\}$ expected during operation of the power amplifier. During calibration, temperatures of the power amplifier may be controlled through a testing or calibration chamber (e.g., which may be used during the power amplifier's time of manufacture). The quiescent drain current ($I_{dq}$) values determined during the calibration phase may be regarded as a set of optimized quiescent drain current ($I_d$) values for the power amplifier while operating under the operational parameters.

Determining one or more quiescent drain current ($I_{dq}$) values for the power amplifier operating under the operational parameters may comprise adjusting the quiescent drain current ($I_{dq}$) of the power amplifier, while the power amplifier is operating under the operational parameters, such that the quiescent drain current ($I_{dq}$) meets satisfies one or more requirements of the power amplifier's intended application. As noted herein, the quiescent drain current ($I_{dq}$) of the power amplifier can be adjusted by controlling the bias of the power amplifier. When the quiescent drain current ($I_{dq}$) satisfies the requirements of the power amplifier's intended application, the bias value used to reach the quiescent drain current ($I_{dq}$) may be recorded. For some embodiments, a spectrum analyzer is utilized to determine whether a given quiescent drain current ($I_{dq}$) satisfies a requirement of the power amplifier's intended application.

The one or more quiescent drain current ($I_{dq}$) values determined for the power amplifier may be stored (e.g., as calibrated drain current data) in a datastore (e.g., flash memory, possibly in some type of database) for future data retrieval and use during the operation phase of the power amplifier. The quiescent drain current ($I_{dq}$) values may be stored according to their one or more corresponding operational parameters, thereby permitting future retrieval based on those operational parameters.

During the calibration phase, a non-quiescent drain current ($I_{dnq}$) of the power amplifier may be calibrated over a set of power levels for the output signal of the power amplifier, thereby resulting in a set of calibrated drain current ($I_d$) values for the power amplifier. Calibrating the non-quiescent drain current ($I_{dnq}$) of the power amplifier over a set of power levels may comprise determining a set of non-quiescent drain current ($I_{dnq}$) values for the power amplifier for the set of power levels and one or more additional operational parameters under which the power amplifier may be operated, or is expected to operate, when used in a particular application of the power amplifier (e.g., user of the power amplifier in RFU transmitter).

For example, calibration of a power amplifier may comprise determining one or more non-quiescent drain current ($I_d$) values for the power amplifier for permutations of the following operational parameters of the power amplifier: a set of power levels $P=\{p_1, p_2, p_3, \ldots p_n\}$ of an output signal of the power amplifier; a set of frequencies $F=\{f_1, f_2, f_3, \ldots f_p\}$ expected for the input signals; and a set of temperatures for the power amplifier $T=\{t_1, t_2, t_3, \ldots t_m\}$ expected during operation of the power amplifier. The non-quiescent drain current ($I_{dnq}$) values determined during the calibration phase may be regarded as a set of calibrated drain current ($I_d$) values for the power amplifier while operating under the operational parameters.

The non-quiescent drain current ($I_{dnq}$) values determined for the power amplifier may be stored (e.g., as calibrated drain current data) in a datastore (e.g., flash memory, possibly in some type of database) for future data retrieval and use during the operation phase of the power amplifier. The non-quiescent drain current ($I_{dnq}$) values may be stored according to their one or more corresponding operational parameters, including the set of power levels. By doing so, the non-quiescent drain current ($I_{dnq}$) values can be subsequently retrieved based on those operational parameters.

For some embodiments, during the calibration phase, a power amplifier is not being utilized by it intended application. For example, where the power amplifier is being used in a radio frequency unit (RFU), the power amplifier may not be in use by the RFU during a calibration process.

During the operation phase, the unit (e.g., RFU) in which the power amplifier is installed may be powered up, a processor (e.g., microcontroller of the unit) may determine (e.g., measure) a present value of the drain current of the power amplifier, and the processor may compare the present drain current value to a saved drain current value (e.g., an optimized quiescent drain current value or a calibrated drain current value) determined during the calibration phase. For some embodiments, the saved drain current value is obtained from the calibrated drain current data stored during the calibration phase. Additionally, for some embodiments, the saved drain current value to which the present drain current value is compared is a saved drain current value that associated with one or more present operational parameters under which the power amplifier is presently operating while the unit is operating (e.g., powered up).

Based on whether the difference between the present drain current value and the saved drain current value satisfies a particular condition, the processor may maintain the drain current at its present drain current value or control (e.g., adjust) the drain current to match or sufficiently match the saved drain current value. The particular condition, for example, (e.g., difference is equal to, more than, less than, more than or equal to, or less than or equal to a predetermined value. The difference may be regarded as the error of the present drain current value in view of the saved drain current value, and the predetermined value may be regarded as an error limit. The particular condition may be determined based on, and vary according to, the intended application of the power amplifier. The particular condition may, for example, correspond to one or more operational constraints (e.g., drain current tolerances) for the power amplifier while it operates in its intended application. In this way, while the power amplifier is operating under a given set of operational parameters, the processor can control the drain current of the power amplifier, based on the drain current values obtained during the calibration phase, such that the power amplifier operates at or at or near optimal levels for the given set of operational parameters.

In one example, after the unit including the power amplifier is turned on, the processor may, at time t, check the present drain current value for the drain current of the power amplifier and determine the following operational parameters under which the power amplifier is presently operating associated with the present drain current value: the present power level $p_t$ for an output signal of the power amplifier; a frequency $f_t$ of an input signal of the power amplifier; and a power amplifier temperature $t_t$. The present drain current value at time t associated with the present operational parameter at time t can be represented herein as $I_{dt}(p_t, f_t, t_t)$. Based on the present operational parameters of $p_t$, $f_t$, and $t_t$ at time t, the processor can obtain (e.g., calibrated drain current data) a saved drain current value associated with the present operational parameters of $p_t$, $f_t$, and $t_t$ at time t. The saved current drain current value at time t associated with the present operational parameter at time t can be represented herein as $I_{ds}(p_t, f_t, t_t)$. The processor may calculate the absolute difference between $I_{dt}(p_t, f_t, t_t)$ between $I_{ds}(p_t, f_t, t_t)$ and determine whether the calculated difference is less than or equal to an error limit $\epsilon$, as follows:

$$|I_{dt}(p_t,f_t,t_t)-I_{ds}(p_t,f_t,t_t)|\le\epsilon.$$

If the calculated difference is less than or equal to an error limit $\epsilon$, the processor may maintain (e.g., keep) the drain current at the present drain current value $I_{dt}(p_t, f_t, t_t)$. If otherwise, the process may adjust the drain current to match the saved current drain current $I_{ds}(p_t, f_t, t_t)$. For some embodiments, adjusting the drain current to match the saved current drain current $I_{ds}(p_t, f_t, t_t)$ is performed after adaptively controlling power of the power amplifier according to a desired output power level, e.g., using a proportional-integral-derivative (PID) process. For some embodiments, the PID process is configured to be performed at a predetermined rate (e.g., a PID loop is performed every 10 Tsecs), and may be performed via a variable-voltage attenuator (VVA) that provides an input signal to the power amplifier.

During the operation phase, the processor may continually or periodically (e.g., based on a time delay, such as 10 minutes) determine a present value of the drain current of the power amplifier and compare the present drain current value to a saved drain current value. Based on the result of the comparison (e.g., difference is more than a predetermined error limit), the drain current of the power amplifier may be adjusted or maintained. By doing so, the processor can continually or periodically adapt the drain current according to one or more of the latest operational parameters under which the power amplifier is operating.

For some embodiments, systems and methods described herein eliminate the need for a "burn-in" procedure for a GaN device or reduce the burn-in time for the GaN device. Systems and methods described herein may maintain long term performance for a GaN device, may improve GaN device reliability and mean time between failures (MTBF), and may achieve optimum operating conditions for a GaN device in different applications. For example, with respect to a GaN power amplifier, various systems and methods described herein may stabilize the GaN power amplifier's performance, maximize its performance for different applications, reduce its production time, or lower its manufacturing cost.

Figure 2:
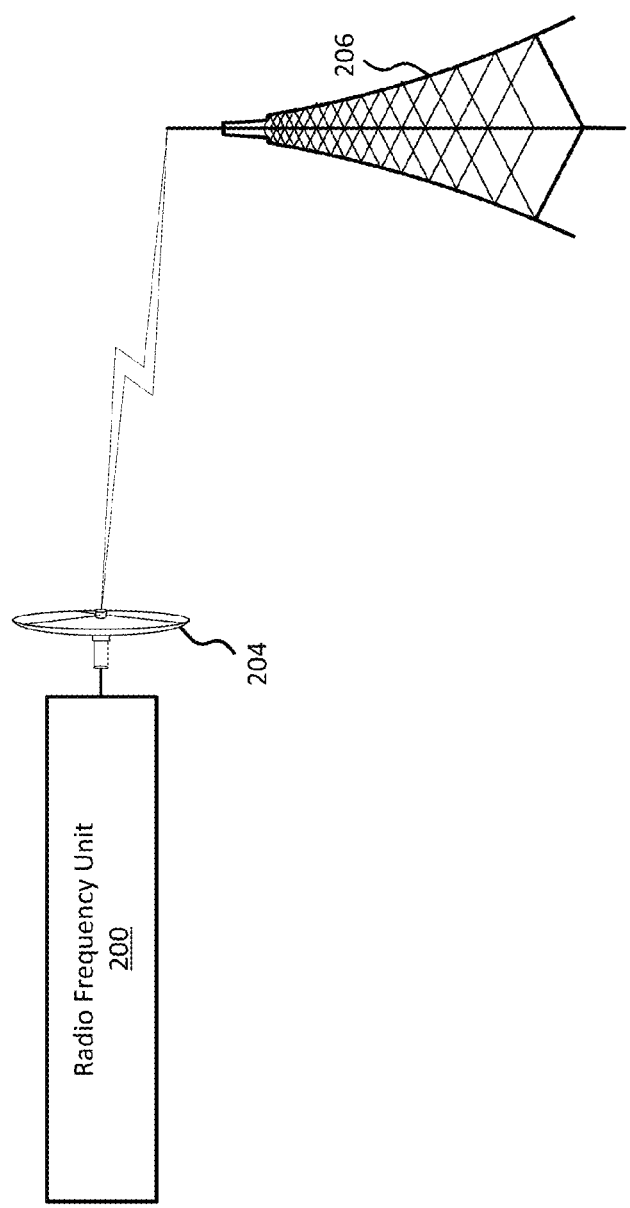
FIG. 2 depicts an example radio frequency unit (RFU) that can utilize a power amplifier in accordance with some embodiments.

FIG. 2 depicts an example radio frequency unit (RFU) 200 that can utilize a GaN power amplifier in accordance with some embodiments. In FIG. 2, the RFU 200 provides a wireless signal to a wireless communication tower 206 (e.g., cell tower or other microwave radio device) via an antenna 204. To provide the wireless signal, the RFU 200 may comprise a GaN power amplifier in accordance with embodiments described herein. Gallium Nitride (GaN) is a wide-band gap semiconductor material that may be operated at a high drain voltage (e.g., in the range of 20 V to 60 V) and may also offer a higher output power capability (e.g., in the range of 4-8 W/mm). As a result, GaN power amplifiers may be easier to match over a wider bandwidth, have better reliability, and improved ruggedness compared to GaAs devices. In addition, the use of a linearization circuitry can allow the operation of the final stage power amplifier in a class AB or Class B mode thus affording much higher power added efficiency (PAE).

Figure 3:
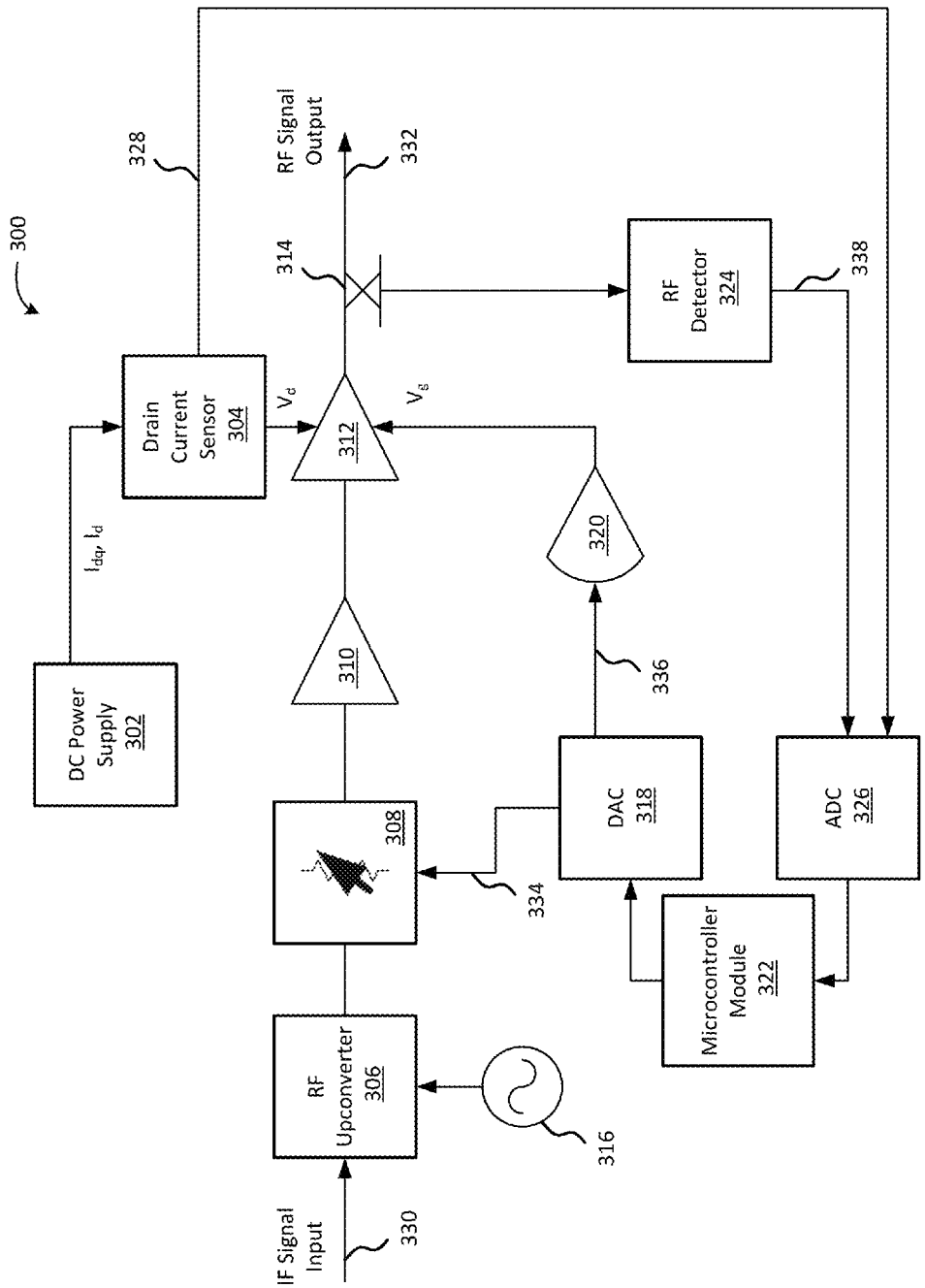
FIG. 3 is a diagram of an example transmitter utilizing a power amplifier in accordance with some embodiments.

FIG. 3 is a diagram of an example transmitter 300 utilizing a power amplifier in accordance with some embodiments. In FIG. 3, the transmitter 300 comprises a direct current (DC) power supply 302, a drain current sensor 304, a radio frequency (RF) upconverter 306, a variable voltage attenuator (VVA) 308, a gain block 310, a power amplifier 312, a coupler 314, a local oscillator 316, a digital-to-analog converter (DAC) 318, a voltage converter 320, a microcontroller module 322, a radio frequency (RF) detector 324, and an analog-to-digital converter (ADC) 326. As shown, the DC power supply 302 is coupled to the drain current sensor 304, the drain current sensor 304 is coupled to the power amplifier 312 and the ADC 326, the local oscillator 316 is coupled to the RF upconverter 306, the RF upconverter 306 is coupled to the VVA 308, the VVA 308 is coupled to the gain block 310, the gain block 310 is coupled to the power amplifier 312, the power amplifier 312 is coupled to the coupler 314, the coupler 314 is coupled to the RF detector 324, the RF detector 324 is coupled to the ADC 326, the ADC 326 is coupled to the microcontroller module 322, the microcontroller module 322 is coupled to the DAC 318, the DAC 318 is coupled to the VVA 308 and the voltage converter 320, and the voltage converter 320 is coupled to the power amplifier 312. Those skilled in the art will appreciate that the composition or arrangement of the transmitter 300 may vary between different embodiments. For some embodiments, one or more of the components of the transmitter 300, such as the microcontroller module 322, are implemented using a digital device, and that digital device may be similar to the one described and depicted with respect to FIG. 7. Additionally, depending on the embodiment, the transmitter 300 may be included, in whole or in part, by the radio frequency unit (RFU) 200 described and depicted herein with respect to FIG. 2.

The DC power supply 302 may be configured to provide power to various components of the transmitter 300 including, for example, the drain current sensor 304, which in turn may provide power to the power amplifier 312. By this arrangement, the DC power supply 302 can provide the power amplifier 312 with its drain voltage ($V_d$), drain current ($I_d$), and quiescent drain current ($I_{dq}$). The drain current sensor 304 may be configured to measure the drain current ($I_d$) or the quiescent drain current ($I_{dq}$) of the power amplifier 312 as the DC power supply 302 provides such current through the drain current sensor 304. The measured value of the drain current ($I_d$) or the quiescent drain current ($I_{dq}$) may be provided through a connection 328 to the ADC 326 for further processing. The measured value of the drain current ($I_d$) or the quiescent drain current ($I_{dq}$) may vary based on a number of factors including, for example, how much power is being provided by the DC power supply 302, the bias (e.g., voltage bias) being applied to the power amplifier 312 (e.g., applied to the power amplifier 312's gate), the load on the output of the power amplifier 312, and the power level of a input signal received by the power amplifier 312.

The RF upconverter 306 may be configured to receive an intermediate frequency (IF) signal via an IF signal input 330, and upconvert the IF signal to a radio frequency (RF) signal (e.g., microwave signal) using the local oscillator 316. According to some embodiments, the local oscillator 316 is a RF oscillator, and the RF upconverter 306 comprises a heterodyne system configured to upconvert the IF signal to the RF signal. The RF upconverter 306 may provide the resulting RF signal to another component of the transmitter 300, such as the VVA 308, for additional processing or transmission (e.g., over a radio link).

The VVA 308 may be configured to adjust one or more electrical properties of the RF signal provided by the RF upconverter 306 including, for example, the voltage, current, or power of the RF signal. The VVA 308 may be further configured to variably adjust the RF signal according to a control signal 334, which may be received from the microcontroller module 322 by way of the DAC 318.

For some embodiments, the VVA 308 is utilized to set or otherwise adjust the power level of the power amplifier 312 and may do so by adjusting the power of the input signal (e.g., the RF signal) that the VVA 308 provides to the power amplifier 312 through the gain block 310. As described herein, the VVA 308 may be utilized to set or otherwise adjust the power level of the power amplifier 312 when the power amplifier 312 is determined to be operating in a low-power mode (e.g., $P_{out} < P_{sens}$) or a high-power mode (e.g., $P_{out} \geq P_{sens}$). For instance, when the power amplifier 312 is operating in a high-power mode, the VVA 308 may set or adjust the power level of the power amplifier 312 to be less than a sensitivity power level and, in doing so, sets the power amplifier 312 to operate in a low-power mode. As described herein, after the power amplifier 312 is set from operating in a high-power mode to operating in a low-power mode, and an adaptive closed-loop control is utilized to adjust the drain current of the power amplifier 312, the VVA 308 may be used to set or adjust the power level of the power amplifier 312 to reach a desired power level for the RF signal output 332. As also described herein, the VVA 308 may be utilized in setting the power level of the power amplifier 312 during adaptive power control of the power amplifier 312, which may utilize a proportional-integral-derivative (PID) process.

The gain block 310 may be any form of amplifier suitable for receiving an IF or RF signal and providing a gain to the IF or RF signal. The gain block 310 may be configured to receive the variably attenuated RF signal from the VVA 308, apply a gain (e.g., a predetermined gain), and provide the resulting RF signal to the power amplifier 312.

The power amplifier 312 may be a GaN power amplifier, and may be configured to receive an input signal (e.g., via a signal input port), amplify the input signal to an output signal, and provide the output signal (e.g., via a signal output port). The power amplifier 312 may receive and be powered by a drain current provided by a power source, such as the DC power supply 302. Amplification of the input signal to an output signal by the power amplifier 312 may be based on (e.g., controlled by) a bias being applied to the power amplifier 312 (e.g., applied to the power amplifier 312's gate) as a control input. As shown in FIG. 3, the bias may be a voltage bias $V_g$ being provided by the voltage converter 320. The voltage converter 320 may be configured to generate and provide voltage bias $V_g$ according to a control signal 336 received from the microcontroller module 322 as converted by the DAC 318. Once the RF signal received by the power amplifier 312 is amplified, the resulting amplified RF signal may be provided for transmission via an RF signal output 332.

The coupler 314 may be configured to sample or split a signal (e.g., an amplified RF signal) being output from the power amplifier 312. In some embodiments, the coupler 314 samples the output signal from the power amplifier 312 and provides the sampled signal to the RF detector 324 for feedback processing. Upon receiving the sampled signal, the RF detector 324 may be configured to detect the presence of the signal or determine one or more characteristics of the sampled signal including, for instance, the frequency, phase, power level (e.g., amplitude) of the received sampled signal. The RF detector 324 may inform another component of the sample signal's presence or characteristics via line 338. For instance, the RF detector 324 may inform the microcontroller module 322 of the sample signal's presence or characteristics through ADC 326 and via the line 338.

The microcontroller module 322 may be configured to control one or more components of the transmitter 300 via one or more control signal outputs. Additionally, the microcontroller module 322 may be configured to control one or more components of the transmitter 300 according to input signals received from one or more components of the transmitter 300. The microcontroller module 322 may include a processor to facilitate its operation. As described herein, the microcontroller module 322 may be implemented, in whole or in part, using a digital device. Analog signals to the microcontroller module 322 (e.g., from the drain current sensor 304 and the RF detector 324) may converted to a digital signal by the ADC 326 before they are received by the microcontroller module 322, and digital signals from the microcontroller module 322 (e.g., for the VVA 308 and for the voltage converter 320) may be converted to analog signals by the DAC 318. For some embodiments, one or more of the methods described herein are performed, in whole or in part, by the microcontroller module 322. The processor included by the microcontroller module 322 may facilitate the performance of steps or operations described herein as described herein.

For some embodiments, the microcontroller module 322 controls the VVA 308 via the control signal 334 provided by the DAC 318, and the VVA 308 in turn controls the input signal provided to the power amplifier 312 via the gain block 310. As described herein, the VVA 308 may control the power level of the power amplifier 312 (e.g., of the output signal of the power amplifier 312) by controlling the input signal provided to the power amplifier 312 by the VVA 308. In some embodiments, the microcontroller module 322 adaptively controls power of the power amplifier 312, via the VVA 308, using a proportional-integral-derivative (PID) process. For instance, the microcontroller module 322 compares the actual output power of the power amplifier 312 as measured by the RF detector 324, with a desired or expected output power for the power amplifier 312, and uses a PID algorithm to adaptively control the VVA 308 to adjust the power level of the power amplifier 312 to achieve the desired or expected output power of the power amplifier 312.

In some embodiments, when applying a closed-loop control to the drain current of the power amplifier 312, the microcontroller module 322 adaptively controls the power of the power amplifier 312 and then sets the drain current of the power amplifier 312 according to a target drain current value associated with the present operational parameter (e.g., temperature or frequency) and power level as measured by the RF detector 324. As described herein, the target drain current value may be one determined, and stored as calibrated drain current data, during a calibration process as described herein.

For some embodiments, the microcontroller module 322 adaptively controls the power of the power amplifier 312 and then sets the drain current of the power amplifier 312 according to a target drain current value (e.g., from the calibrated drain current data) when the power amplifier 312 is operating in a low-power mode (e.g., power level of the output signal of the power amplifier 312 is lower than the sensitivity power level).

In various embodiments, the microcontroller module 322 controls the drain current of the power amplifier 312 by controlling a bias to the power amplifier 312's gate voltage ($V_g$). In FIG. 3, the bias to the power amplifier 312's gate voltage through the control signal 336 to the voltage converter 320.

Figure 4:
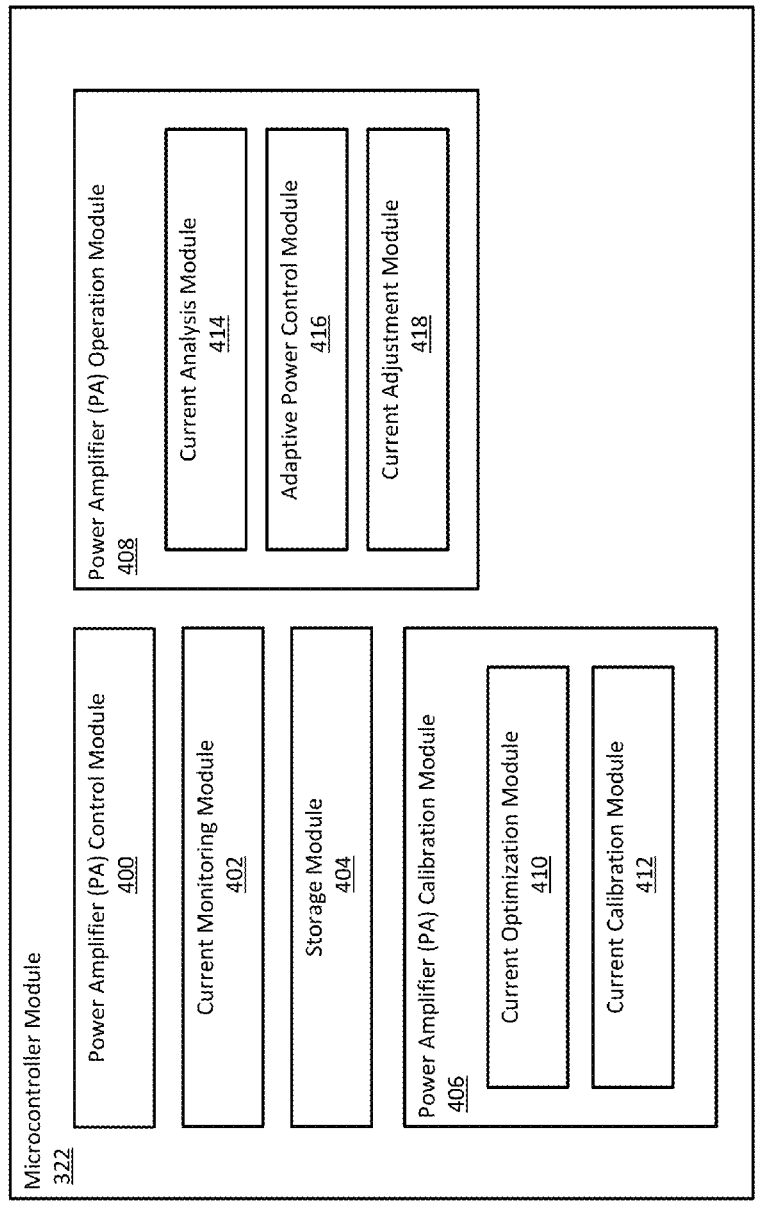
FIG. 4 is a block diagram of an example microcontroller module that can be utilized with a power amplifier in accordance with some embodiments.

FIG. 4 is a block diagram of the microcontroller module 322 that can be utilized with a power amplifier in accordance with some embodiments. In FIG. 4, the microcontroller module 322 comprises a power amplifier (PA) control module 400, a current monitoring module 402, a storage module 404, a power amplifier (PA) calibration module 406, and a power amplifier (PA) operation module 408. The PA calibration module 406 comprises a current optimization module 410 and a current calibration module 412. The PA operation module 408 comprises a current analysis module 414, an adaptive power control module 416, and a current adjustment module 418. Those skilled in the art will appreciate that the composition or arrangement of microcontroller module 322 may vary between different embodiments. As described herein, one or more of the methods described herein may be performed, in whole or in part, by the microcontroller module 322. As also described herein, the microcontroller module 322 may be implemented, in whole or in part, using a digital device, and that digital device may be similar to the one described and depicted with respect to FIG. 7.

The PA control module 400 may be configured to facilitate control of the power amplifier 312, and may do so by controlling drain current of the power amplifier 312. For some embodiments, the PA control module 400 controls the drain current of the power amplifier 312 by controlling the voltage bias $V_g$ provided to the power amplifier 312. In some embodiments, the voltage converter 320 provides the voltage bias $V_g$ to the power amplifier 312, and the PA control module 400 controls the voltage converter 320 via control signals through the DAC 318.

The current monitoring module 402 may be configured to facilitate measurement of the drain current of the power amplifier 312, and may do so by through the drain current sensor 304. According to some embodiments, the drain current sensor 304 measures the drain current provided by the DC power supply 302 to the power amplifier 312, and provides the measured value to the current monitoring module 402 as a signal. The signal provided by the drain current sensor 304 may be analog and require conversion through the ADC 326 before being received by the current monitoring module 402.

The storage module 404 may be configured to facilitate storage and retrieval of various data as various components of the microcontroller module 322 perform operations. In some embodiments, the storage module 404 stores and subsequently retrieves drain current values used by the PA calibration module 406 or the PA operation module 408 during a calibration or operation phase of the power amplifier 312. The storage module 404 may utilize or include some form of memory (e.g., flash memory) or datastore to facilitate storage and retrieval of data for operations of the microcontroller module 322. In certain embodiments, the storage module 404 stores a set of drain current values, in association with operational parameters, and calibrated with a set of power levels of the power amplifier 312. The storage module 404 may store the set of drain current values to, and subsequently retrieve drain current values from, a calibration file.

The PA calibration module 406 may be configured to facilitate calibration phase operations, as described herein, with respect to the power amplifier 312. For example, during calibration of the power amplifier 312, the current optimization module 410 may be configured to determine one or more quiescent drain current ($I_{dq}$) values for the power amplifier 312 for one or more operational parameters under which the power amplifier 312 may be operated, or is expected to operate, when used for signal transmission in the transmitter 300. The operational parameters for the power amplifier 312 may, for example, comprise permutations of the following operational parameters: a set of frequencies $F=\{f_1, f_2, f_3, \ldots f_p\}$ expected for the input signals during operation of the power amplifier 312; and a set of power amplifier temperatures $T=\{t_1, t_2, t_3, \ldots t_m\}$ expected during operation of the power amplifier 312. Determining one or more quiescent drain current ($I_{dq}$) values for the power amplifier 312 operating under the operational parameters may comprise adjusting the quiescent drain current ($I_{dq}$) of the power amplifier 312, via the voltage bias $V_g$ applied by the voltage converter 320, while the power amplifier 312 is operating under the operational parameters. The quiescent drain current ($I_{dq}$) values determined during by the current optimization module 410 may be regarded as a set of optimized quiescent drain current ($I_d$) values for the power amplifier 312 while operating under the operational parameters. Additionally, the one or more quiescent drain current ($I_{dq}$) values determined by the current optimization module 410 for the power amplifier 312 may be stored as calibrated drain current data by the storage module 404, and may be done so according to their one or more corresponding operational parameters, output power levels, or both (e.g. to permit future retrieval based on those operational parameters, output power levels, or both).

The current calibration module 412 may be configured to determine a set of non-quiescent drain current ($I_{dnq}$) values for the power amplifier 312 for a set of power levels $P=\{p_1, p_2, p_3, \ldots p_n\}$ and additional operational parameters under which the power amplifier 312 may be operated, or is expected to operate when used for signal transmission in the transmitter 300. The additional operational parameters may comprise permutations of the following operational parameters: a set of frequencies $F=\{f_1, f_2, f_3, \ldots f_p\}$ expected for the input signals during operation of the power amplifier 312; and a set of power amplifier temperatures $T=\{t_1, t_2, t_3, \ldots t_m\}$ expected during operation of the power amplifier 312. The non-quiescent drain current ($I_{dnq}$) values determined by the current calibration module 412 may be regarded as a set of calibrated drain current ($I_d$) values for the power amplifier 312 while operating under the operational parameters. Additionally, the non-quiescent drain current ($I_{dnq}$) values determined by the current calibration module 412 for the power amplifier 312 may be stored as calibrated drain current data by the storage module 404, and may be done so according to their one or more corresponding operational parameters (e.g. to permit future retrieval based on those operational parameters).

The PA operation module 408 may be configured to facilitate operation phase operations, as described herein, with respect to the power amplifier 312. For instance, during the operation phase of the power amplifier 312 (e.g., when the power amplifier 312 is being used in the transmitter 300 to transmits signals), the current analysis module 414 may be configured to receive a present value of the drain current of the power amplifier 312 as measured by the drain current sensor 304, and compare the present drain current value to a saved drain current value (e.g., an optimized quiescent drain current value or a calibrated drain current value) determined during the calibration phase and saved through the storage module 404. Through the storage module 404, the current analysis module 414 may obtain the saved drain current value from the calibrated drain current data. As described herein, for some embodiments, the saved drain current value to which the present drain current value is compared is a saved drain current value that associated with one or more present operational parameters under which the power amplifier 312 is presently operating while the transmitter 300 is operating.

Based on whether the difference between the present drain current value and the saved drain current value satisfies a particular condition, the current analysis module 414 may maintain the drain current at its present drain current value or control (e.g., adjust) the drain current to match or sufficiently match the saved drain current value.

The adaptive power control module 416 may be configured to adaptively control the power of the power amplifier 312. According to some embodiments, the adaptive power control module 416 controls the VVA 308 via the control signal 334 provided by the DAC 318, and the VVA 308 in turn controls the input signal provided to the power amplifier 312 via the gain block 310. As described herein, the VVA 308 may control the power level of the power amplifier 312 (e.g., of the output signal of the power amplifier 312) by controlling the input signal provided to the power amplifier 312. The adaptive power control module 416 may adaptively control power of the power amplifier 312, via the VVA 308, using a proportional-integral-derivative (PID) process. The adaptive power control module 416 may compare the actual output power of the power amplifier 312 as measured by the RF detector 324, with a desired or expected output power of the power amplifier 312, and use a PID algorithm to adaptively control the VVA 308 to adjust the power level of the power amplifier 312 to achieve the desired or expected output power of the power amplifier 312.

The current adjustment module 418 may be configured to control the drain current (e.g., while applying a closed-loop control to the drain current) when the drain current needs to be controlled to match or sufficiently match the present drain current value to the saved drain current value. According to some embodiments, the current adjustment module 418 controls the drain current to the saved drain current value by controlling the voltage bias $V_g$ applied by the voltage converter 320 to the power amplifier 312's gate and measuring the present drain current value (as provided by the drain current sensor 304) until the present drain current value matches or substantially matches the saved drain current value.

Those skilled in the art will appreciate that the components of FIG. 3 described above with respect to the components of FIG. 4 are merely examples of components that may be used with the microcontroller module 322, and that other components may also be utilized in some embodiments.

Figure 5:
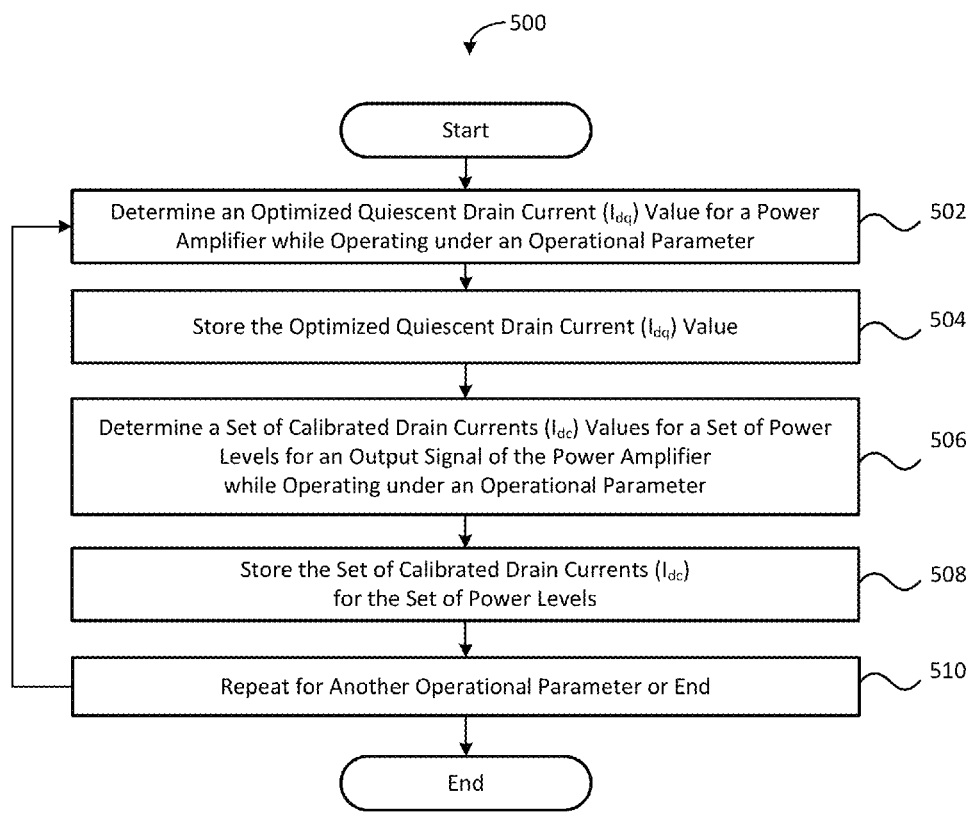
FIG. 5 is a flow diagram of an example method for calibrating a power amplifier in accordance with some embodiments.

FIG. 5 is a flow diagram of an example method 500 for calibrating a power amplifier in accordance with some embodiments. The method 500 begins at step 502 with the current optimization module 410 determining an optimized quiescent drain current ($I_{dq}$) value for the power amplifier 312 while the power amplifier 312 is operation under an operational parameter. At step 504, the storage module 404 stores the optimized quiescent drain current ($I_{dq}$) value, and may store it as calibrated drain current data. At step 506, the current calibration module 412 determines a set of calibrated drain current ($I_{dc}$) values for a set of power levels for an output signal of the power amplifier 312 while the power amplifier 312 is operating under the operational parameter. At step 508, the storage module 404 stores the set of calibrated drain current ($I_{dc}$) values, and may store it as calibrated drain current data. At step 510, can either return to step 502 and repeat the method 500 for another operational parameter or end the method 500. In some embodiments, the calibrated drain current data is stored in a calibration file that can be utilized during operation of the power amplifier 312. As described herein, based on a target drain current value provided by the calibration file (e.g., for a given operational parameter and power level of the power amplifier 312), the gate voltage of the power amplifier 312 can be biased to achieve the target drain current value.

Though the steps of the method 500 may be depicted and described in a certain order, those skilled in the art will appreciate that the order in which the steps are performed may vary between different embodiments. Additionally, those skilled in the art will appreciate that the components described above with respect to the method 500 are merely examples of components that may be used with the method 500, and that other components may also be utilized in some embodiments.

Figure 6:
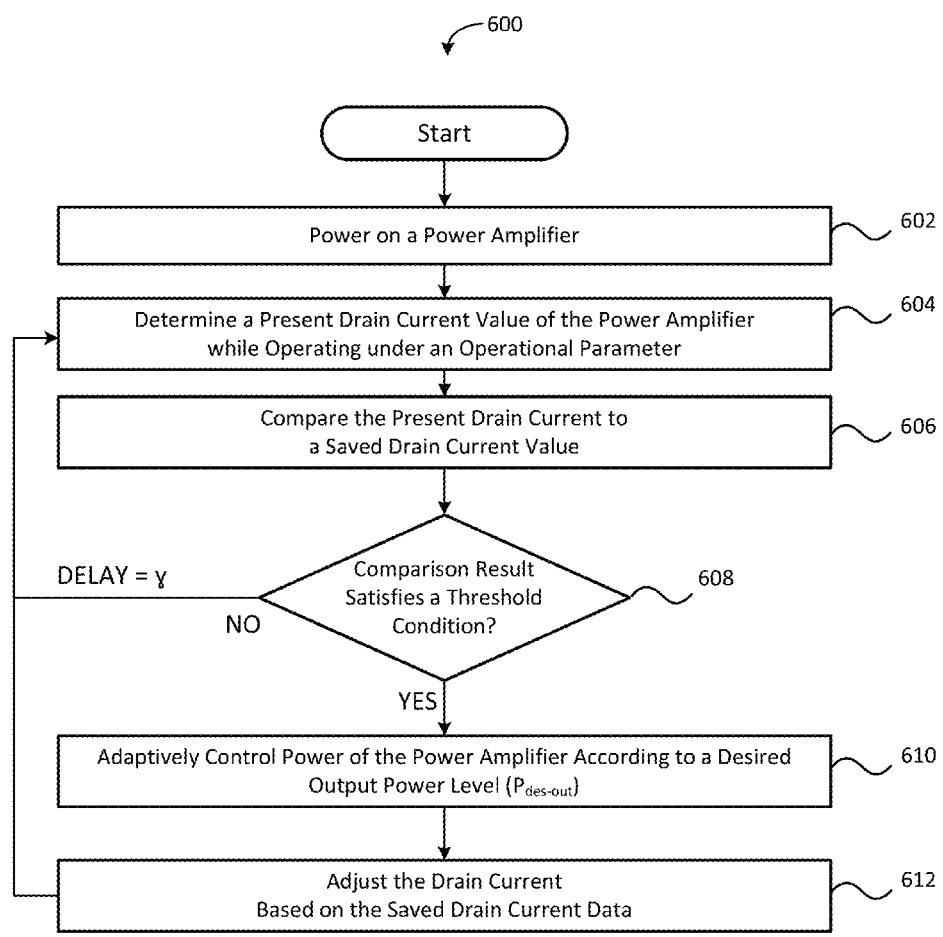
FIG. 6 is a flow diagram of an example method for operating a power amplifier in accordance with some embodiments.

FIG. 6 is a flow diagram of an example method 600 for operating a power amplifier in accordance with some embodiments. The method 600 begins at step 602 the PA control module 400 powers on the power amplifier 312 (e.g., from a power-off state). At step 604, the current monitoring module 402 determines (e.g., measures) a present drain current value of the power amplifier 312 while the power amplifier 312 is operating under an operational parameter. At step 606, the current analysis module 414 compares the determined drain current value to a saved drain current value (e.g., from the calibrated drain current data), which may have been generated during the method 500. For some embodiments, for step 606, the current analysis module 414 compares the determined drain current value to a saved drain current value by calculating the difference between the determined drain current value and the saved drain current value. Once calculated, the current analysis module 414 can compare the difference against an error threshold at step 608. In this way, the error threshold can define when the present drain current value for the power amplifier 312 is considered less than desirable or optimal during operation of the power amplifier 312. Depending on the embodiment, the error threshold may be determined during a calibration process or at the time of a transmitter or transceiver's manufacture.

If at step 608, the current analysis module 414 determines that the result of comparing the determined drain current value to the saved drain current value satisfies a threshold condition, the method 600 continues to step 610. If during step 608 the current analysis module 414 determines that the result comparing the determined drain current value to the saved drain current value does not satisfy the threshold condition, the method 600 returns to step 604 and the method 600 repeats itself from step 604. According to some embodiments, the method 600 returns to step 604 after a predetermined time delay (e.g., 10 minutes).

At step 610, the adaptive power control module 416 adaptively controls the power of the amplifier 312 according to a desired power level ($P_{des-out}$), and may do so by controlling the VVA 308 providing the input signal to the power amplifier 312 (via the gain block 310). As described herein, the adaptive power control module 416 may adaptively control the power of the amplifier 312 using a proportional-integral-derivative (PID) process, which may loop at a predetermined interval (e.g., 10 Tsecs). The desired power level ($P_{des-out}$) may serve as the set point in the PID process.

Subsequently, at step 612, the current adjustment module 418 adjusts the drain current of the power amplifier 312 based on the saved drain current value associated with the present operational parameter (e.g., frequency and temperature) and power level of the power amplifier 312 after step 610. For some embodiments, the current adjustment module 418 determines the power level of the power amplifier 312 after step 610 using the power level measurement provided by the RF detector 324.

Though the steps of the method 600 may be depicted and described in a certain order, those skilled in the art will appreciate that the order in which the steps are performed may vary between different embodiments. Additionally, those skilled in the art will appreciate that the components described above with respect to the method 600 are merely examples of components that may be used with the method 600, and that other components may also be utilized in some embodiments.

Figure 7:
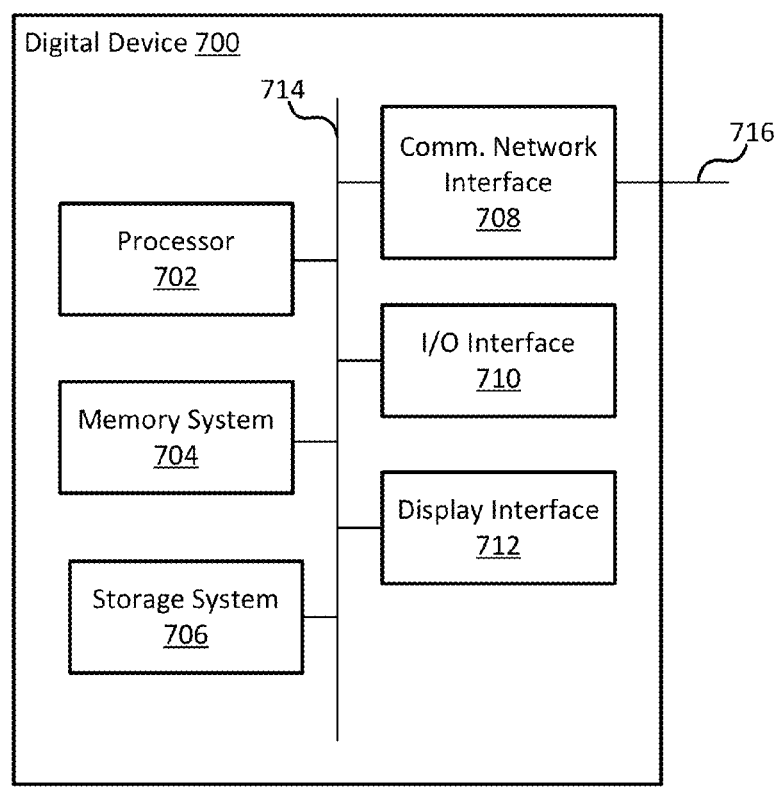
FIG. 7 depicts an example digital device according to some embodiments.

FIG. 7 depicts an example digital device 700 according to some embodiments. The digital device 700 comprises a processor 702, a memory system 704, a storage system 706, a communication network interface 708, an I/O interface 710, and a display interface 712 communicatively coupled to a bus 714. The processor 702 may be configured to execute executable instructions (e.g., programs). In some embodiments, the processor 702 comprises circuitry or any processor capable of processing the executable instructions.

The memory system 704 is any memory configured to store data. Some examples of the memory system 704 are storage devices, such as RAM or ROM. The memory system 704 may comprise the RAM cache. In various embodiments, data is stored within the memory system 704. The data within the memory system 704 may be cleared or ultimately transferred to the storage system 706.

The storage system 706 is any storage configured to retrieve and store data. Some examples of the storage system 706 are flash drives, hard drives, optical drives, or magnetic tape. In some embodiments, the digital device 700 includes a memory system 704 in the form of RAM and a storage system 706 in the form of flash data. Both the memory system 704 and the storage system 706 comprise computer readable media that may store instructions or programs that are executable by a computer processor including the processor 702.

The communication network interface (com. network interface) 708 may be coupled to a data network via the link 716. The communication network interface 708 may support communication over an Ethernet connection, a serial connection, a parallel connection, or an ATA connection, for example. The communication network interface 708 may also support wireless communication (e.g., 802.11a/b/g/n, WiMAX). It will be apparent to those skilled in the art that the communication network interface 708 may support many wired and wireless standards.

The optional input/output (I/O) interface 710 is any device that receives input from the user and output data. The optional display interface 712 is any device that may be configured to output graphics and data to a display. In one example, the display interface 712 is a graphics adapter.

It will be appreciated by those skilled in the art that the hardware elements of the digital device 700 are not limited to those depicted in FIG. 7. A digital device 700 may comprise more or less hardware elements than those depicted. Further, hardware elements may share functionality and still be within various embodiments described herein. In one example, encoding or decoding may be performed by the processor 702 or a co-processor located on a GPU.

Figure 8:
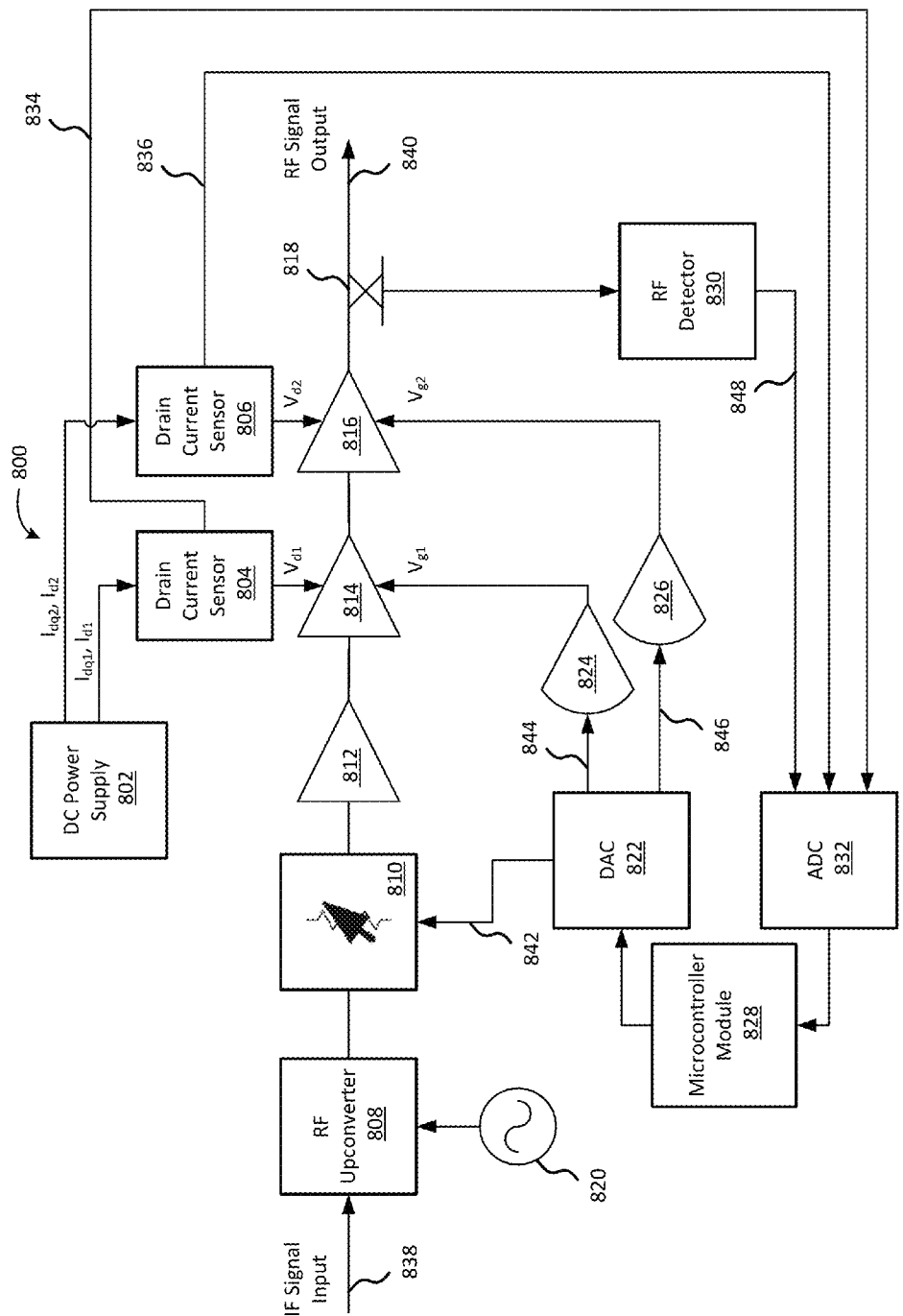
FIG. 8 is a diagram of an example transmitter utilizing a power amplifier in accordance with some embodiments.

FIG. 8 is a diagram of an example transmitter 800 utilizing a power amplifier in accordance with some embodiments. In FIG. 8, the transmitter 800 comprises a direct current (DC) power supply 802, drain current sensors 804 and 806, a radio frequency (RF) upconverter 808, a variable voltage attenuator (VVA) 810, a gain block 812, power amplifiers 814 and 816, a coupler 818, a local oscillator 820, a digital-to-analog converter (DAC) 822, voltage converters 824 and 826, a microcontroller module 828, a radio frequency (RF) detector 830, and an analog-to-digital converter (ADC) 832. As shown, the DC power supply 802 is coupled to the drain current sensors 804 and 806, the drain current sensors 804 and 806 are respectively coupled to the power amplifiers 814 and 816, the drain current sensors 804 and 806 are coupled to the ADC 832, the local oscillator 820 is coupled to the RF upconverter 808, the RF upconverter 808 is coupled to the VVA 810, the VVA 810 is coupled to the gain block 812, the gain block 812 is coupled to the power amplifier 814, the power amplifier 814 is coupled to the power amplifier 816, the power amplifier 816 is coupled to the coupler 818, the coupler 818 is coupled to the RF detector 830, the RF detector 830 is coupled to the ADC 832, the ADC 832 is coupled to the microcontroller module 828, the microcontroller module 828 is coupled to the DAC 822, the DAC 822 is coupled to the VVA 810 and the voltage converters 824 and 826, the voltage converter 824 is coupled to the power amplifier 814, the voltage converter 826 is coupled to the power amplifier 816. Those skilled in the art will appreciate that the composition or arrangement of the transmitter 800 may vary between different embodiments. For some embodiments, one or more of the components of the transmitter 800, such as the microcontroller module 828, are implemented using a digital device, and that digital device may be similar to the one described and depicted with respect to FIG. 7. Additionally, depending on the embodiment, the transmitter 800 may be included, in whole or in part, by the radio frequency unit (RFU) 200 described and depicted herein with respect to FIG. 2.

The DC power supply 802 may be configured to provide power to various components of the transmitter 800 including, for example, the drain current sensors 804 and 806, which may respectively provide power to the power amplifiers 814 and 816. By this arrangement, the DC power supply 802 can provide the power amplifiers 814 and 816 with their respective drain voltages ($V_{d1}$ and $V_{d2}$), drain currents ($I_{d1}$ and $I_{d2}$), and quiescent drain currents ($I_{dq1}$ and $I_{dq2}$). The drain current sensor 804 may be configured to measure the drain current ($I_{d1}$) or the quiescent drain current ($I_{dq1}$) of the power amplifier 814 as the DC power supply 802 provides such current through the drain current sensor 804. Likewise, the drain current sensor 806 may be configured to measure the drain current ($I_{d2}$) or the quiescent drain current ($I_{dq2}$) of the power amplifier 816 as the DC power supply 802 provides such current through the drain current sensor 806.

The value of the drain current ($I_{d1}$) or the quiescent drain current ($I_{dq1}$), as measured by the drain current sensor 804, may be provided to the ADC 832 for further processing through a connection 834. Similarly, the value of the drain current ($I_{d2}$) or the quiescent drain current ($I_{dq2}$), as measured by the drain current sensor 806, may be provided to the ADC 832 for further processing through a connection 836. The measured value of the drain currents ($I_{d1}$ and $I_{d2}$) or the quiescent drain currents ($I_{dq1}$ and $I_{dq2}$) may vary based on a number of factors including, for example, how much power is being provided by the DC power supply 802, the bias (e.g., voltage bias) being applied to each of the power amplifiers 814 and 816 (e.g., applied to the power amplifier 814's gate, and applied to the power amplifier 816's gate), the load on the output of each of the power amplifiers 814 and 816, and the power level of a input signal received by each of the power amplifiers 814 and 816.

The RF upconverter 808 may be configured to receive an intermediate frequency (IF) signal via an IF signal input 838, and upconvert the IF signal to a radio frequency (RF) signal (e.g., microwave signal) using the local oscillator 820. According to some embodiments, the local oscillator 820 is a RF oscillator, and the RF upconverter 808 comprises a heterodyne system configured to upconvert the IF signal to the RF signal. The RF upconverter 808 may provide the resulting RF signal to another component of the transmitter 800, such as the VVA 810, for additional processing or transmission (e.g., over a radio link).

The VVA 810 may be configured to adjust one or more electrical properties of the RF signal provided by the RF upconverter 808 including, for example, the voltage, current, or power of the RF signal. The VVA 810 may be further configured to variably adjust the RF signal according to a control signal 842, which may be received from the microcontroller module 828 by way of the DAC 822.

For some embodiments, the VVA 810 is utilized to set or otherwise adjust the power level of the power amplifiers 814 and 816 and may do so by adjusting the power of the input signal (e.g., the RF signal) that the VVA 810 provides to the power amplifier 814 through the gain block 812, which in turn influences the output signal the power amplifier 814 provides to the power amplifier 816. In a two-stage power amplifier configuration as shown in in FIG. 8, the VVA 810 may be utilized to set or otherwise adjust the power level of the power amplifier 816 depending on whether the power amplifier 816 is determined to be operating in a low-power mode (e.g., $P_{out} < P_{sens}$) or a high-power mode (e.g., $P_{out} \geq P_{sens}$). For instance, when the power amplifier 816 is operating in a high-power mode, the VVA 810 may set or adjust the power level of the power amplifier 816 to be less than a sensitivity power level and, in doing so, sets the power amplifier 816 to operate in a low-power mode. After the power amplifier 816 is set from operating in a high-power mode to operating in a low-power mode, and an adaptive closed-loop control is utilized to adjust the drain current of the power amplifier 816, the VVA 810 may be used to set or adjust the power level of the power amplifier 816 to reach a desired power level for the power level for the RF signal output 840. As also described herein, the VVA 810 may be utilized in setting the power level of the power amplifiers 814 and 816 during adaptive power control of the power amplifiers 814 and 816, which may utilize a proportional-integral-derivative (PID) process.

The gain block 812 may be any form of amplifier suitable for receiving an IF or RF signal and providing a gain to the IF or RF signal. The gain block 812 may be configured to receive the variably-attenuated RF signal from the VVA 810, apply a gain (e.g., a predetermined gain), and provide the resulting RF signal to the power amplifier 814.

Each of the power amplifiers 814 and 816 may be a GaN power amplifier, and may be configured to receive an input signal (e.g., via a signal input port), amplify the input signal to an output signal, and provide the output signal (e.g., via a signal output port). In FIG. 8, the power amplifiers 814 and 816 are configured to function as a two-stage amplifier, which as a while permits a larger amplification of the input signal provided by the gain block 812 than otherwise possible using a single power amplifier (single-stage amplifier). As a two-stage amplifier, the power amplifiers 814 and 816 may have useful where the transmitter generates a microwave RF signal for transmission. As shown, each of the power amplifiers 814 and 816 may receive and be powered by a drain current ($I_{d1}$ and $I_{d2}$) provided by the DC power supply 802. Amplification of the input signal to an output signal by the power amplifier 814 may be based on (e.g., controlled by) a bias being applied to the power amplifier 814 (e.g., applied to the power amplifier 814's gate) as a control input. Amplification of the input signal to an output signal by the power amplifier 816 may be similarly based on (e.g., controlled by) a bias being applied to the power amplifier 814 (e.g., applied to the power amplifier 814's gate) as a control input. As shown in FIG. 8, the bias applied to the power amplifier 814 may be a voltage bias $V_{g1}$ being provided by the voltage converter 824, and the bias applied to the power amplifier 816 may be a voltage bias $V_{g2}$ being provided by the voltage converter 826. Depending on the embodiment, the systems and processes described herein may apply a closed-loop control to the drain current of the power amplifier 814, the power amplifier 816, or both during operation mode of the power amplifier 816 and 816.

The voltage converter 824 may be configured to generate and provide voltage bias $V_{g1}$ according to a control signal 844 received from the microcontroller module 828 as converted by the DAC 822. Likewise, the voltage converter 826 may be configured to generate and provide voltage bias $V_{g2}$ according to a control signal 846 received from the microcontroller module 828 as converted by the DAC 822. Once the RF signal received by the power amplifier 814 is amplified, amplified by the power amplifier 814, received by the power amplifier 816, and amplified by the power amplifier 816, the resulting amplified RF signal may be provided for transmission via an RF signal output 840.

The coupler 818 may be configured to sample or split a signal (e.g., an amplified RF signal) being output from the power amplifier 816. In some embodiments, the coupler 818 samples the output signal from the power amplifier 816 and provides the sampled signal to the RF detector 830 for feedback processing. Upon receiving the sampled signal, the RF detector 830 may be configured to detect the presence of the signal or determine one or more characteristics of the sampled signal including, for instance, the frequency, phase, power level (e.g., amplitude) of the received sampled signal. The RF detector 830 may inform another component of the sample signal's presence or characteristics via line 848. For instance, the RF detector 830 may inform the microcontroller module 828 of the sample signal's presence or characteristics through ADC 832 and via the line 848.

The microcontroller module 828 may be configured to control one or more components of the transmitter 800 via one or more control signal outputs. Additionally, the microcontroller module 828 may be configured to control one or more components of the transmitter 800 according to input signals received from one or components of the transmitter 800. The microcontroller module 828 may include a processor to facilitate its operation. As described herein, the microcontroller module 828 may be implemented, in whole or in part, using a digital device. Analog signals to the microcontroller module 828 (e.g., from the drain current sensors 804 and 806 and the RF detector 830) may converted to a digital signal by the ADC 832 before they are received by the microcontroller module 828, and digital signals from the microcontroller module 828 (e.g., for the VVA 810 and for the voltage converters 824 and 826) may be converted to analog signals by the DAC 822. For some embodiments, one or more of the methods described herein are performed, in whole or in part, by the microcontroller module 828. The processor included by the microcontroller module 828 may facilitate the performance of steps or operations described herein as described herein.

For some embodiments, the microcontroller module 828 controls the VVA 810 via a control signal provided by the DAC 822 over the connection 834, and the VVA 810 in turn controls the input signal provided to the power amplifier 814 via the gain block 812. As described herein, the VVA 810 may control the power level of the power amplifiers 814 and 816 (e.g., of the output signal of each of the power amplifiers 814 and 816) by controlling the input signal provided to the power amplifier 814 by the VVA 810. In some embodiments, the microcontroller module 828 adaptively controls power of both the power amplifier 814 and the power amplifier 816, via the VVA 810, using a proportional-integral-derivative (PID) process. For instance, the microcontroller module 828 compares the actual output power provided by the power amplifier 816, as measured by the RF detector 830, with a desired or expected output power for the power amplifiers 814 and 816, and uses a PID algorithm to adaptively control the VVA 810 to adjust the power level of the input signal provided to the power amplifier 814 to achieve the desired or expected output power from the power amplifiers 814 and 816.

In some embodiments, when applying a closed-loop control to the drain current of the power amplifier 814 or the power amplifier 816, the microcontroller module 828 adaptively controls the power of the input signal provided to the power amplifier 814 and then sets the drain current of the power amplifier 814 or the power amplifier 816 according to a target drain current value associated with the present operational parameter (e.g., temperature or frequency) and power level measured by the RF detector 830. As described herein, the target drain current value may be one determined, and stored as calibrated drain current data, during a calibration process as described herein. For some embodiments, the microcontroller module 828 adaptively controls the power of the power amplifiers 814 and 816 and then sets the drain current of the power amplifier 816, the power amplifier 816, or both according to a respective target drain current value (e.g., from the calibrated drain current data) when the power amplifiers 814 and 816 are operating in a low-power mode (e.g., power level of the output signal of the power amplifier 816 is lower than the sensitivity power level).

In various embodiments, the microcontroller module 828 controls the drain current of the power amplifier 814 by controlling a bias to the power amplifier 814's gate voltage ($V_{g1}$), and the microcontroller module 828 controls the drain current of the power amplifier 816 by controlling a bias to the power amplifier 816's gate voltage ($V_{g2}$). In FIG. 8, the bias to the power amplifier 814's gate voltage through the control signal 844 to the voltage converter 824, and the bias to the power amplifier 816's gate voltage through the control signal 846 to the voltage converter 826.

Figure 9:
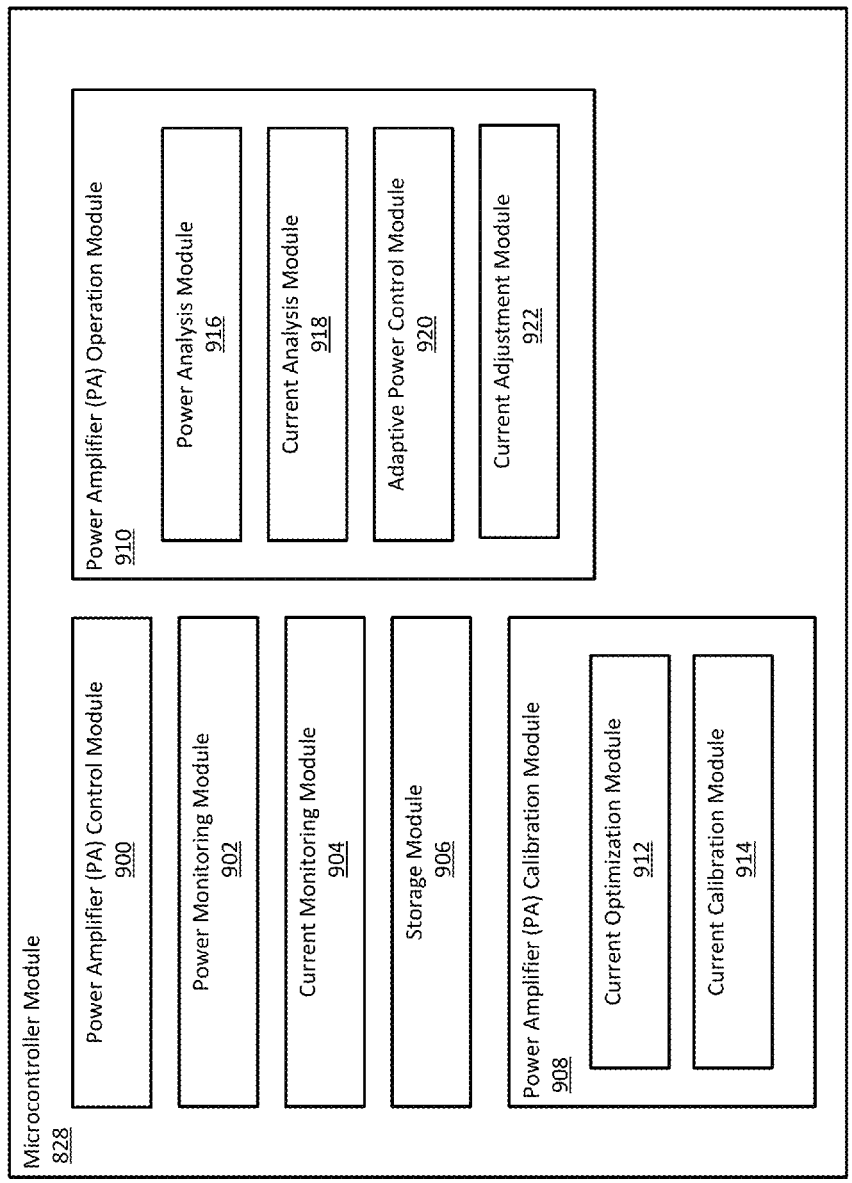
FIG. 9 is a block diagram of an example microcontroller module that can be utilized with a power amplifier in accordance with some embodiments.

FIG. 9 is a block diagram of an example microcontroller module 828 that can be utilized with a power amplifier in accordance with some embodiments. In FIG. 9, the microcontroller module 828 comprises a power amplifier (PA) control module 900, a power monitoring module 902, a current monitoring module 904, a storage module 906, a power amplifier (PA) calibration module 908, and a power amplifier (PA) operation module 910. The PA calibration module 908 comprises a current optimization module 912 and a current calibration module 914. The PA operation module 910 comprises a power analysis module 916, a current analysis module 918, an adaptive power control module 920, and a current adjustment module 922. Those skilled in the art will appreciate that the composition or arrangement of microcontroller module 828 may vary between different embodiments. As described herein, one or more of the methods described herein may be performed, in whole or in part, by the microcontroller module 828. As also described herein, the microcontroller module 828 may be implemented, in whole or in part, using a digital device, and that digital device may be similar to the one described and depicted with respect to FIG. 7.

The PA control module 900 may be configured to facilitate control of the power amplifier 312, and may do so by controlling drain current of the power amplifier 312. For some embodiments, the PA control module 900 controls the drain current of each of the power amplifiers 814 and 816 by controlling their respective voltage bias $V_{g1}$ and $V_{g2}$. In some embodiments, the voltage converter 824 provides the voltage bias $V_{g1}$ to the power amplifier 814, and the PA control module 900 controls the voltage converter 824 via control signals through the DAC 318. Additionally, in some embodiments, the voltage converter 320 provides the voltage bias $V_{g2}$ to the power amplifier 814, and the PA control module 900 controls the voltage converter 826 via control signals through the DAC 318.

The current monitoring module 904 may be configured to facilitate measurement of the drain current of each of the power amplifiers 814 and 816, and may respectively do so by through the drain current sensors 804 and 806. According to some embodiments, the drain current sensor 804 measures the drain current provided by the DC power supply 302 to the power amplifier 814, and provides the measured value to the current monitoring module 904 as a signal. Similarly, the drain current sensor 806 measures the drain current provided by the DC power supply 302 to the power amplifier 816, and provides the measured value to the current monitoring module 904 as a signal. The signal provided by the drain current sensors 804 and 806 may be analog and require conversion through the ADC 832 before being received by the current monitoring module 904.

The storage module 906 may be configured to facilitate storage and retrieval of various data as various components of the microcontroller module 828 perform operations. In some embodiments, the storage module 906 stores and subsequently retrieves drain current values used by the PA calibration module 908 or the PA operation module 910 during a calibration or operation phase of the power amplifiers 814 and 816. The storage module 906 may utilize or include some form of memory (e.g., flash memory) or datastore to facilitate storage and retrieval of data for operations of the microcontroller module 828. In certain embodiments, the storage module 906 stores a set of drain current values, in association with operational parameters, and calibrated with a set of power levels of the power amplifiers 814 and 816. The storage module 906 may store the set of drain current values to, and subsequently retrieve drain current values from, a calibration file.

Depending on the embodiment, the PA calibration module 908 and the PA operation module 910 may be used to calibrate and operate the power amplifier 814, the power amplifier 816, or both. For embodiments involving a two-stage power amplifier configuration similar to that of the power amplifier 814 and 816, the PA calibration module 908 and the PA operation module 910 perform operations primarily with respect to the power amplifier at the latest stage (i.e., the power amplifier 816), as it is the last power amplifier to influence signal produced by the power amplifiers 814 and 816.

The PA calibration module 908 may be configured to facilitate calibration phase operations, as described herein, with respect to the power amplifier 814, the power amplifier 816, or both. For instance, during calibration of the power amplifier 816, the current optimization module 912 may be configured to determine one or more quiescent drain current ($I_{dq}$)

values for the power amplifier 816 for one or more operational parameters under which the power amplifier 816 may be operated, or is expected to operate, when used for signal transmission in the transmitter 800. The operational parameters for the power amplifiers 814 and 816 may, for example, comprise permutations of the following operational parameters: a set of frequencies $F=\{f_1, f_2, f_3, \ldots f_p\}$ expected for the input signals during operation of the power amplifier 312; and a set of power amplifier temperatures $T=\{t_1, t_2, t_3, \ldots t_m\}$ expected during operation of the power amplifier 814 and 816. Determining one or more quiescent drain current ($I_{dq}$) values for the power amplifier 816 operating under the operational parameters may comprise adjusting the quiescent drain current ($I_{dq}$) of the power amplifier 816, via the voltage bias $V_{g2}$ applied by the voltage converter 826, while the power amplifier 816 is operating under the operational parameters. The quiescent drain current ($I_{dq}$) values determined during by the current optimization module 912 may be regarded as a set of optimized quiescent drain current ($I_d$) values for the power amplifier 816 while operating under the operational parameters. Additionally, the one or more quiescent drain current ($I_{dq}$) values determined by the current optimization module 912 for the power amplifier 816 may be stored as calibrated drain current data by the storage module 906, and may be done so according to their one or more corresponding operational parameters, output power levels, or both (e.g. to permit future retrieval based on those operational parameters, output power levels, or both).

The current calibration module 914 may be configured to determine a set of non-quiescent drain current ($I_{dnq}$) values for the power amplifier 816 for a set of power levels $P=\{p_1, p_2, p_3, \ldots p_n\}$ and additional operational parameters under which the power amplifier 816 may be operated, or is expected to operate when used for signal transmission in the transmitter 800. The additional operational parameters may comprise permutations of the following operational parameters: a set of frequencies $F=\{f_1, f_2, f_3, \ldots f_p\}$ expected for the input signals during operation of the power amplifiers 814 and 816; and a set of power amplifier temperatures $T=\{t_1, t_2, t_3, \ldots t_m\}$ expected during operation of the power amplifiers 814 and 816. The non-quiescent drain current ($I_{dnq}$) values determined by the current calibration module 914 may be regarded as a set of calibrated drain current ($I_d$) values for the power amplifier 816 while operating under the operational parameters. Additionally, the non-quiescent drain current ($I_{dnq}$) values determined by the current calibration module 914 for the power amplifier 816 may be stored as calibrated drain current data by the storage module 906, and may be done so according to their one or more corresponding operational parameters (e.g. to permit future retrieval based on those operational parameters).

The PA operation module 910 may be configured to facilitate operation phase operations, as described herein, with respect to the power amplifier 814, the power amplifier 816, or both. For instance, the power analysis module 916 may be configured to determine whether the power amplifier 814, the power amplifier 816, or both are operating in a low-power mode, a high-power mode. The power analysis module 916 may also be configured to determine whether the power amplifier 814, the power amplifier 816, or both are operating in an Automatic Transmit Power Control (ATPC) mode. For some embodiments, the power analysis module 916 may determine the power mode of the power amplifier 816 by receiving a power level measurement of the output signal produced by the power amplifier 816 (as provide by the RF detector 830), and comparing the power level measurement to a sensitivity power level that delimits between low-power and high-power operation. For example, the power analysis module 916 may determine that the power amplifier 816 is operating in a low-power mode when the power level measurement is less than the sensitivity power level ($P_{out} < P_{sens}$), and operating in a high-power mode when the power level measurement is more than or equal to ($P_{out} \geq P_{sens}$). Those skilled in the art will appreciate that the conditions for low-power mode and high-power mode may differ between different embodiments.

During the operation phase of the power amplifier 816 (e.g., when the power amplifier 816 is being used in the transmitter 800 to transmits signals), the current analysis module 918 may be configured to receive a present value of the drain current of the power amplifier 816 as measured by the drain current sensor 806, and compare the present drain current value to a saved drain current value (e.g., an optimized quiescent drain current value or a calibrated drain current value) determined during the calibration phase and saved through the storage module 906. Through the storage module 906, the current analysis module 918 may obtain the saved drain current value from the calibrated drain current data. As described herein, for some embodiments, the saved drain current value to which the present drain current value is compared is a saved drain current value that associated with one or more present operational parameters under which the power amplifier 816 is presently operating while the transmitter 800 is operating.

Based on whether the difference between the present drain current value and the saved drain current value satisfies a particular condition, the current analysis module 918 may maintain the drain current at its present drain current value or control (e.g., adjust) the drain current to match or sufficiently match the saved drain current value.

The adaptive power control module 920 may be configured to adaptively control the power of the power amplifier 814, the power amplifier 816, or both. According to some embodiments, the adaptive power control module 920 controls the VVA 810 via the control signal 842 provided by the DAC 822, and the VVA 810 in turn controls the input signal provided to the power amplifiers 814 via the gain block 310. As described herein, the VVA 810 may control the power level of the power amplifiers 814 and 816 (e.g., of the output signal of the power amplifier 312) by controlling the input signal provided to the power amplifier 814. The adaptive power control module 920 may adaptively control power of the power amplifiers 814 and 816, via the VVA 810, using a proportional-integral-derivative (PID) process. The adaptive power control module 920 may compare the actual output power provided by the power amplifier 816, as measured by the RF detector 830, with a desired or expected output power for the power amplifiers 814 and 816, and then use a PID algorithm to adaptively control the VVA 810 to adjust the power level of the input signal provided to the power amplifier 814 to achieve the desired or expected output power from the power amplifiers 814 and 816.

The current adjustment module 922 may be configured to control the drain current (e.g., while applying a closed-loop control to the drain current) when the drain current needs to be controlled to match or sufficiently match the present drain current value to the saved drain current value. According to some embodiments, the current adjustment module 922 controls the drain current to the saved drain current value by controlling the voltage bias $V_{g2}$ applied by the voltage converter 826 to the power amplifier 816's gate and measuring the present drain current value of the power amplifier 816 (as provided by the drain current sensor 806) until the present drain current value of the power amplifier 816 matches or substantially matches the saved drain current value.

Those skilled in the art will appreciate that the components of FIG. 3 described above with respect to the components of FIG. 9 are merely examples of components that may be used with the microcontroller module 828, and that other components may also be utilized in some embodiments.

Figure 10:
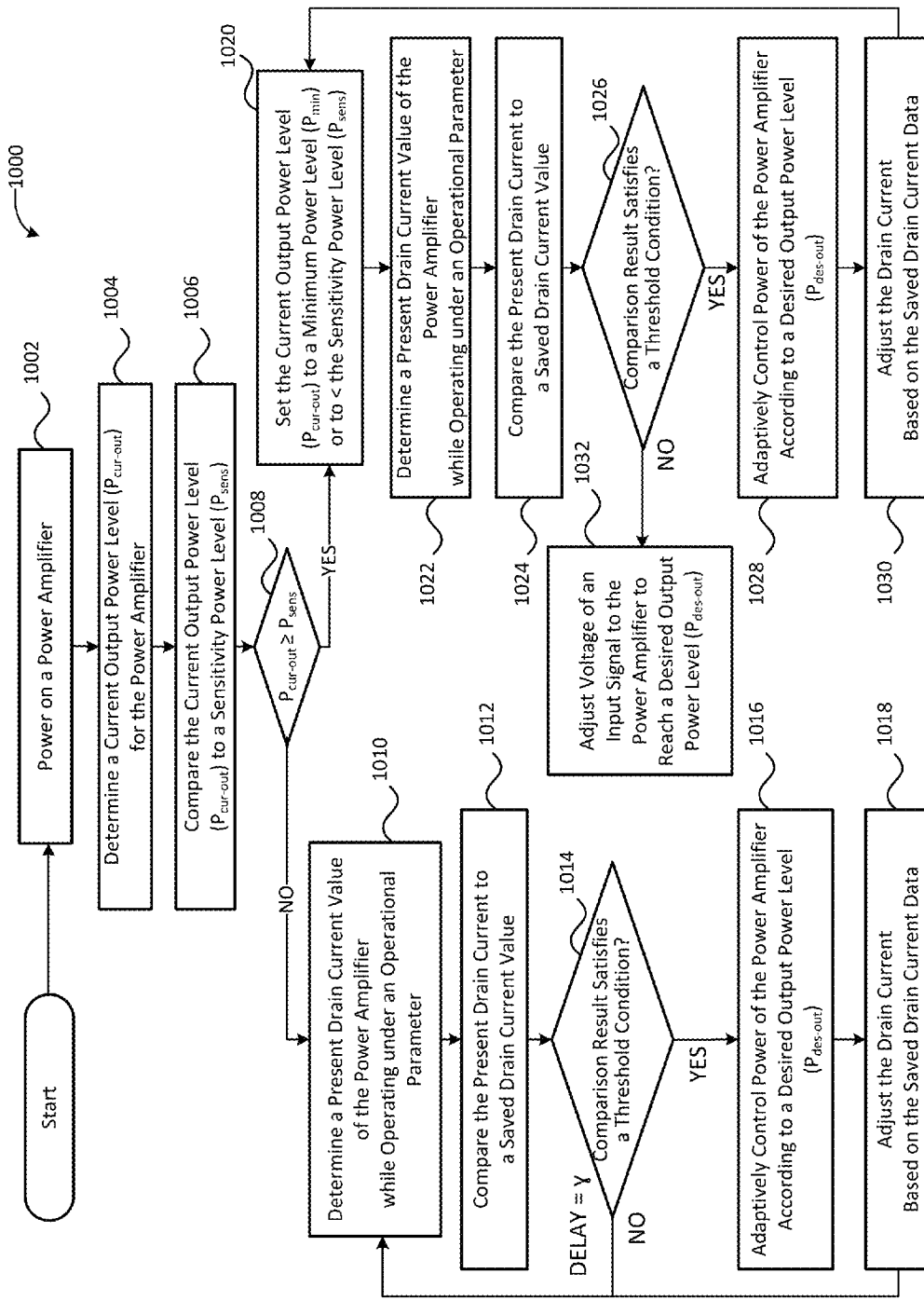
FIG. 10 is a flow diagram of an example method for operating a power amplifier in accordance with some embodiments.

FIG. 10 is a flow diagram of an example method 1000 for operating a power amplifier in accordance with some embodiments. Though the steps of the method 1000 will be described below with respect to the power amplifier 816 alone, those skilled in the art will appreciate that this is merely for illustrative purposes. It will be understood that for some embodiments, the method 1000 may be performed with respect to the power amplifier 814 alone or both the power amplifier 814 and the power amplifier 816.

The method 1000 begins at step 1002 the PA control module 400 powers on the power amplifier 816 (e.g., from a power-off state). At step 1004, the power analysis module 916 determines (e.g., measures) the current output power level ($P_{cur-out}$) from the power amplifier 816. As described herein, the power analysis module 916 may determine the current output power level ($P_{cur-out}$) by receiving, from the RF detector 830, a power level measurement for the output signal of the power amplifier 816. Using the power level measurement, at step 1006, the power analysis module 916 may compare the power measurement level to a sensitivity power level ($P_{sens}$) that designates between a low-power operation and high-power operation of the power amplifier 816.

At step 1008, if the power analysis module 916 determines that the current output power level ($P_{cur-out}$) for the power amplifier 816 is less than the sensitivity power level ($P_{sens}$), the power amplifier is in low-power mode and the method continues step 1010. If however at step 1008 the power analysis module 916 determines that the current output power level ($P_{cur-out}$) for the power amplifier 816 is more than or equal to the sensitivity power level ($P_{sens}$), the power amplifier is in high-power mode and the method continues step 1020.

At step 1010, the current monitoring module 904 determines (e.g., measures) a present drain current value of the power amplifier 816 while the power amplifier 816 is operating under an operational parameter and the current output power level ($P_{cur-out}$). At step 1012, the current analysis module 918 compares the determined drain current value to a saved drain current value (e.g., from the calibrated drain current data), which may have been generated during the method 500. For some embodiments, the current analysis module 918 compares the determined drain current value to a saved drain current value by calculating the difference between the determined drain current value and the saved drain current value. Once calculated, the current analysis module 918 can compare the difference against an error threshold at step 1014. In this way, the error threshold can define when the present drain current value for the power amplifier 816 is considered less than desirable or optimal during operation of the power amplifier 816. Depending on the embodiment, the error threshold may be determined during a calibration process or at the time of a transmitter or transceiver's manufacture.

If at step 1014, the current analysis module 918 determines that the result of comparing the determined drain current value to the saved drain current value satisfies a threshold condition (e.g., drain current difference higher than threshold), the method 1000 continues to step 1016. If however during step 1014 the current analysis module 918 determines that the result comparing the determined drain current value to the saved drain current value does not satisfy the threshold condition, the method 1000 returns to step 1010 and the method 1000 repeats itself from step 1010. According to some embodiments, the method 1000 returns to step 1010 after a predetermined time delay (e.g., 10 minutes).

At step 1016, the adaptive power control module 920 adaptively controls the power of the power amplifier 816 according to a desired power level ($P_{des-out}$), and may do so by controlling the VVA 810 providing the input signal to the power amplifier 816 (via the gain block 812 and the power amplifier 814). As described herein, the adaptive power control module 920 may adaptively control the power of the power amplifier 816 using a proportional-integral-derivative (PID) process, which may loop at a predetermined interval (e.g., 10 Tsecs). The desired power level ($P_{des-out}$) may serve as the set point in the PID process.

Subsequently, at step 1018, the current adjustment module 922 adjusts the drain current ($I_{d2}$) of the power amplifier 816 based on the saved drain current value associated with the present operational parameter (e.g., frequency and temperature) and power level of the power amplifier 816 after step 1016. For some embodiments, the current adjustment module 922 determines the power level of the power amplifier 816 after step 1016 using the power level measurement provided by the RF detector 830.

At step 1020, the PA control module 900 (or the adaptive power control module 920) sets the current output power level ($P_{cur-out}$) to a minimum power level ($P_{min}$) for the power amplifier 816, or sets the current output power level ($P_{cur-out}$) to be less than the sensitivity power level ($P_{sens}$). The PA control module 900 (or the adaptive power control module 920) may achieve this by controlling the power of the input signal provided to the power amplifier 816 (via the gain block 812 and the power amplifier 814) using the VVA 810. Subsequently, at step 1022, the current monitoring module 904 determines (e.g., measures) a present drain current value of the power amplifier 816 while the power amplifier 816 is operating under an operational parameter and the current output power level ($P_{cur-out}$). At step 1024, the current analysis module 918 compares the determined drain current value to a saved drain current value (e.g., from the calibrated drain current data), which may have been generated during the method 500. If at step 1026, the current analysis module 918 determines that the result of comparing the determined drain current value to the saved drain current value satisfies a threshold condition (e.g., drain current difference higher than threshold), the method 1000 proceeds to step 1028. If at step 1026 the current analysis module 918 determines otherwise, the method proceeds to step 1032.

At step 1028, the adaptive power control module 920 adaptively controls the power of the power amplifier 816 according to a desired power level ($P_{des-out}$), and may do so by controlling the VVA 810 providing the input signal to the power amplifier 816 (via the gain block 812 and the power amplifier 814). Thereafter, at step 1030, the current adjustment module 922 adjusts the drain current ($I_{d2}$) of the power amplifier 816 based on the saved drain current value associated with the present operational parameter (e.g., frequency and temperature) and power level of the power amplifier 816 after step 1016. As described herein, the current adjustment module 922 may determine the power level of the power amplifier 816 after step 1016 using the power level measurement provided by the RF detector 830.

At step 1032, the PA control module 900 (or the adaptive power control module 920) adjusts the input signal received by the power amplifier 816 (via the gain block 812 and the power amplifier 814), using the VVA 810, to reach the desired output power level ($P_{des-out}$) for the power amplifier 816.

Though the steps of the method 1000 may be depicted and described in a certain order, those skilled in the art will appreciate that the order in which the steps are performed may vary between different embodiments. Additionally, those skilled in the art will appreciate that the components described above with respect to the method 1000 are merely examples of components that may be used with the method 1000, and that other components may also be utilized in some embodiments.

Figure 11:
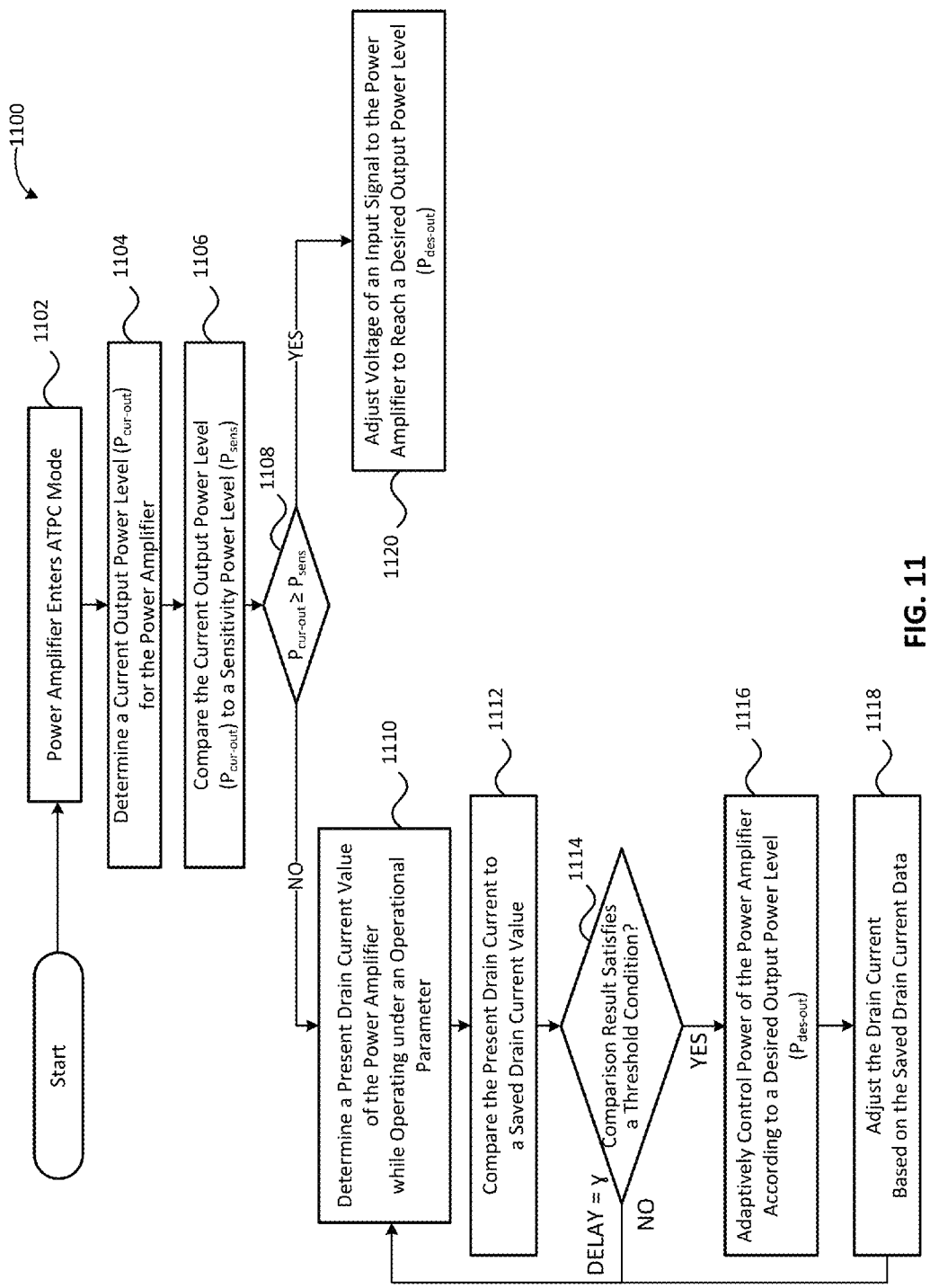
FIG. 11 is a flow diagram of an example method for operating a power amplifier in accordance with some embodiments.

FIG. 11 is a flow diagram of an example method 1100 for operating a power amplifier in accordance with some embodiments. Though the steps of the method 1100 will be described below with respect to the power amplifier 816 alone, those skilled in the art will appreciate that this is merely for illustrative purposes. It will be understood that for some embodiments, the method 1100 may be performed with respect to the power amplifier 814 alone or both the power amplifier 814 and the power amplifier 816.

For some embodiments, the method 1100 is performed in addition to, or as an alternative to method 1000 of FIG. 10, when a power amplifier (e.g., the power amplifier 816) is determined to be operating in Automatic Transmit Power Control (ATPC) mode. Depending on the embodiment, a power amplifier may be requested to enter into ATPC mode during fading path conditions (e.g., due to weather conditions), when higher bit-error rate (BER) is typically observed. When requested to enter ATPC mode, the power amplifier may be set to operate in higher power level than before the request, but this higher power level may not necessarily surpass the sensitivity power level designating between low and high-power modes. Once the fading conditions disappear, the power amplifier may exit ATPC mode.

The method 1100 begins at step 1102 the PA control module 400 requests the power amplifier 816 to enter ATPC mode. At step 1104, the power analysis module 916 determines (e.g., measures) the current output power level ($P_{cur-out}$) from the power amplifier 816. As described herein, the power analysis module 916 may determine the current output power level ($P_{cur-out}$) by receiving, from the RF detector 830, a power level measurement for the output signal of the power amplifier 816. Using the power level measurement, at step 1106, the power analysis module 916 may compare the power measurement level to a sensitivity power level ($P_{sens}$) that designates between a low-power operation and high-power operation of the power amplifier 816.

At step 1108, if the power analysis module 916 determines that the current output power level ($P_{cur-out}$) for the power amplifier 816 is less than the sensitivity power level ($P_{sens}$), the power amplifier is in low-power mode and the method continues step 1110. If however at step 1108 the power analysis module 916 determines that the current output power level ($P_{cur-out}$) for the power amplifier 816 is more than or equal to the sensitivity power level ($P_{sens}$), the power amplifier is in high-power mode and the method continues step 1120.

At step 1110, the current monitoring module 904 determines (e.g., measures) a present drain current value of the power amplifier 816 while the power amplifier 816 is operating under an operational parameter and the current output power level ($P_{cur-out}$). At step 1112, the current analysis module 918 compares the determined drain current value to a saved drain current value (e.g., from the calibrated drain current data), which may have been generated during the method 500. For some embodiments, the current analysis module 918 compares the determined drain current value to a saved drain current value by calculating the difference between the determined drain current value and the saved drain current value. Once calculated, the current analysis module 918 can compare the difference against an error threshold at step 1114. In this way, the error threshold can define when the present drain current value for the power amplifier 816 is considered less than desirable or optimal during operation of the power amplifier 816. Depending on the embodiment, the error threshold may be determined during a calibration process or at the time of a transmitter or transceiver's manufacture.

If at step 1114, the current analysis module 918 determines that the result of comparing the determined drain current value to the saved drain current value satisfies a threshold condition (e.g., drain current difference higher than threshold), the method 1100 continues to step 1116. If however during step 1114 the current analysis module 918 determines that the result comparing the determined drain current value to the saved drain current value does not satisfy the threshold condition, the method 1100 returns to step 1110 and the method 1100 repeats itself from step 1110. According to some embodiments, the method 1100 returns to step 1110 after a predetermined time delay (e.g., 11 minutes).

At step 1116, the adaptive power control module 920 adaptively controls the power of the power amplifier 816 according to a desired power level ($P_{des-out}$), and may do so by controlling the VVA 810 providing the input signal to the power amplifier 816 (via the gain block 812 and the power amplifier 814). As described herein, the adaptive power control module 920 may adaptively control the power of the power amplifier 816 using a proportional-integral-derivative (PID) process, which may loop at a predetermined interval (e.g., 11 Tsecs). The desired power level ($P_{des-out}$) may serve as the set point in the PID process.

Subsequently, at step 1118, the current adjustment module 922 adjusts the drain current ($I_{d2}$) of the power amplifier 816 based on the saved drain current value associated with the present operational parameter (e.g., frequency and temperature) and power level of the power amplifier 816 after step 1116. For some embodiments, the current adjustment module 922 determines the power level of the power amplifier 816 after step 1116 using the power level measurement provided by the RF detector 830.

At step 1120, the PA control module 900 (or the adaptive power control module 920) adjusts the input signal received by the power amplifier 816 (via the gain block 812 and the power amplifier 814), using the VVA 810, to reach the desired output power level ($P_{des-out}$) for the power amplifier 816.

Though the steps of the method 1100 may be depicted and described in a certain order, those skilled in the art will appreciate that the order in which the steps are performed may vary between different embodiments. Additionally, those skilled in the art will appreciate that the components described above with respect to the method 1100 are merely examples of components that may be used with the method 1100, and that other components may also be utilized in some embodiments.

Figure 12:
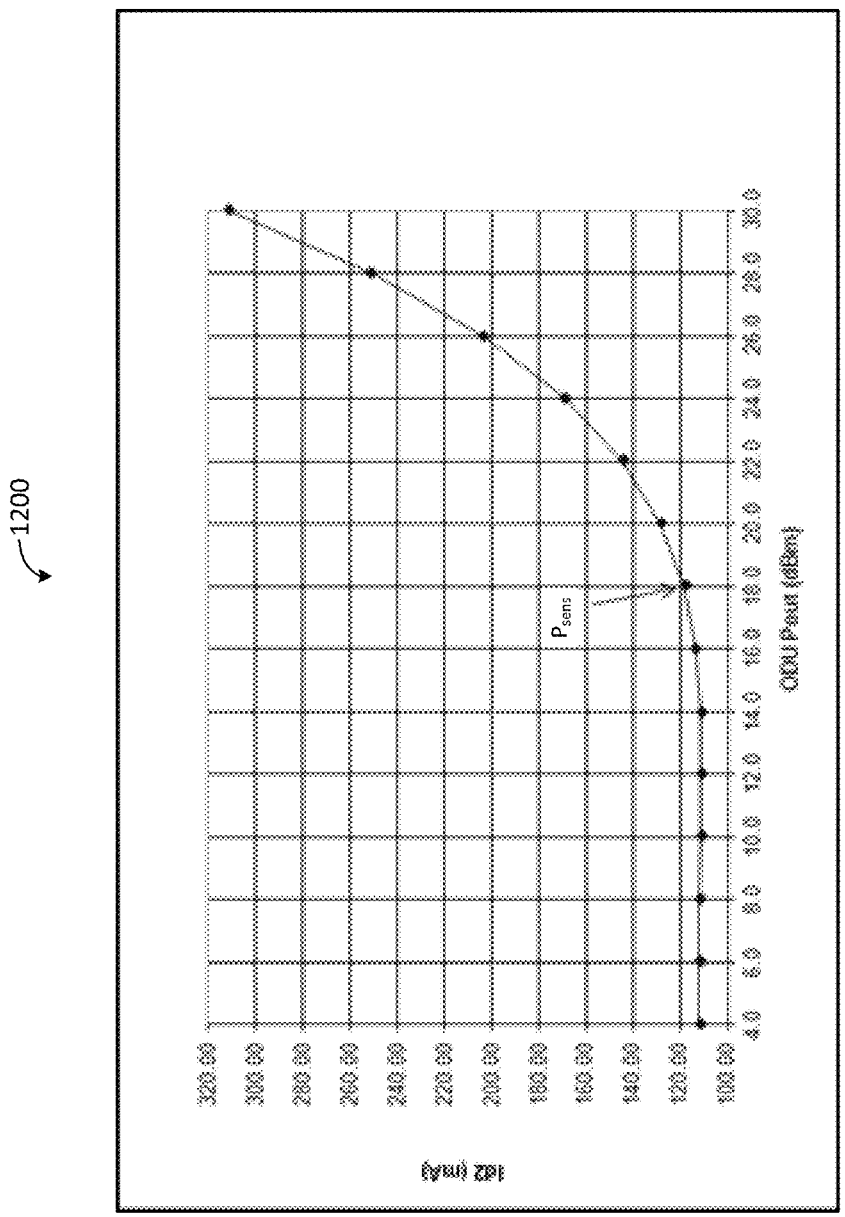
FIG. 12 is a chart depicting a drain current for a power amplifier versus an output power level for the power amplifier for a fixed quiescent drain current setting in accordance with some embodiments.

FIG. 12 is a chart 1200 depicting a drain current for a power amplifier versus an output power level for the power amplifier for a fixed quiescent drain current setting in accordance with some embodiments. In FIG. 12, a sensitivity power level ($P_{sens}$) indicates the switch-point between the power amplifier operating in low-power mode and operating in high-power mode. In particular, the chart 1200 depicts the change of the drain current ($I_{d2}$) of the transmitter 800 versus the output power level ($P_{out}<P_{sens}$) of the RF signal output 840. For some embodiments, where the power level for the output signal of the power amplifier ($P_{out}$) is less than the sensitivity power level ($P_{out}<P_{sens}$), the power amplifier is operating in low-power mode. In various embodiments, where the power level for the output signal of the power amplifier ($P_{out}$) is more than or equal to the sensitivity power level ($P_{out} \geq P_{sens}$), the power amplifier is operating in high-power mode. As described herein, when the power amplifier is operating in low-power mode when the power amplifier is turned on, systems and methods may apply a closed-loop control to the drain current of the power amplifier. Further, when the power amplifier is operating in high-power mode when the power amplifier is turned on, systems and methods may set the power amplifier to operate in the low-power mode, apply the closed-loop control of the drain current of the power amplifier, and then adjust the power level of the power amplifier (e.g., via a variable-voltage attenuator) to reach a desired power level.

One or more functions may be stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some embodiments. Those skilled in the art are familiar with instructions, processor(s), and storage medium.

Various embodiments are described herein as examples. It will be apparent to those skilled in the art that various modifications may be made and other embodiments can be used.

We claim:

1. A method comprising:
   determining whether a power amplifier is operating in a low-power mode or a high-power mode, the power amplifier having an input signal, an output signal, and a drain current;
   if the power amplifier is operating in the high-power mode, setting the power amplifier to operate in the low-power mode, applying a first closed-loop control of the drain current while the power amplifier is operating in the low-power mode, and maintaining the drain current as determined by the first closed-loop control while adjusting a voltage of the input signal of the power amplifier to reach a desired power level for the output signal of the power amplifier; and
   if the power amplifier is operating in the low-power mode, applying a second closed-loop control of the drain current according to the desired power level for the output signal of the power amplifier.

2. The method of claim 1, further comprising:
   determining whether the power amplifier is operating in an Automatic Transmit Power Control (ATPC) mode;
   determining whether the power amplifier is operating in the low-power mode or the high-power mode while operating in the ATPC mode; and
   if the power amplifier is operating in the ATPC mode and the high-power mode, maintaining the drain current while adjusting the voltage of the input signal of the power amplifier to reach the desired power level.

3. The method of claim 2, further comprising if the power amplifier is operating in the ATPC mode and the low-power mode, applying the second closed-loop control of the drain current according to the desired power level for the output signal of the power amplifier.

4. The method of claim 1, wherein the power amplifier is a GaN power amplifier.

5. The method of claim 1, wherein the setting the power amplifier to operate in the low-power mode comprises setting the output signal of the power amplifier to a transitory power level that is less than a sensitivity power level, and wherein the applying the first closed-loop control of the drain current comprises:
   adaptively controlling power of the power amplifier according to the transitory power level; and
   adjusting the drain current based on a calibrated drain current value associated with a present operational parameter of the power amplifier and a present power level of the output signal of the power amplifier after the adaptively controlling power of the power amplifier, the calibrated drain current value being obtained from calibrated drain current data including a set of drain current values associated with a set of operational parameters.

6. The method of claim 5, wherein the adaptively controlling the power of the amplifier comprises a proportional-integral-derivative (PID) process.

7. The method of claim 5, wherein the present operational parameter is a frequency of the input signal of the power amplifier, a phase of the input signal of the power amplifier, a power level of the input signal of the power amplifier, or a temperature associated with the power amplifier.

8. The method of claim 5, wherein the adjusting the drain current based on the calibrated drain current value comprises adjusting the drain current of the power amplifier to match or substantially match the calibrated drain current value.

9. The method of claim 5, the set of drain current values including a set of quiescent drain current values optimized for the set of operational parameters, and a set of non-quiescent drain current values for the set of operational parameters, the set of non-quiescent drain current values being calibrated for a set of power levels for the output signal of the power amplifier.

10. The method of claim 1, wherein the applying the second closed-loop control of the drain current comprises:
    adaptively controlling power of the power amplifier according to the desired power level; and
    adjusting the drain current based on a calibrated drain current value associated with a present operational parameter of the power amplifier and a present power level of the output signal of the power amplifier after the adaptively controlling power of the power amplifier, the calibrated drain current value being obtained from calibrated drain current data including a set of drain current values associated with a set of operational parameters.

11. The method of claim 1, wherein the adjusting the voltage of the input signal of the power amplifier to reach the desired power level for the power amplifier comprises adjusting a variable voltage attenuator that assists in providing the input signal to the power amplifier.

12. The method of claim 1, wherein the power amplifier is operating in the low-power mode when a present power level of the output signal of the power amplifier is less than or equal to a sensitivity power level that designates between the low-power mode and the high-power mode of the power amplifier.

13. The method of claim 1, wherein the power amplifier is operating in the high-power mode when a present power level of the output signal of the power amplifier is more than or equal to a sensitivity power level that designates between the low-power mode and the high-power mode of the power amplifier.

14. A system comprising:
    means for determining whether a power amplifier is operating in a low-power mode or a high-power mode, the power amplifier having an input signal, an output signal, and a drain current;
    means for, if the power amplifier is operating in the high-power mode, setting the power amplifier to operate in the low-power mode, applying a first closed-loop control of the drain current while the power amplifier is operating in the low-power mode, and maintaining the drain current as determined by the first closed-loop control while adjusting a voltage of the input signal of the power amplifier to reach a desired power level for the output signal of the power amplifier; and means for, if the power amplifier is operating in the low-power mode, applying a second closed-loop control of the drain current according to the desired power level for the output signal of the power amplifier.

15. A system comprising:

a power amplifier having an input signal, an output signal, and a drain current; and a microcontroller module including a processor and a non-transitory computer-readable medium storing instructions configured to cause the processor to:
 determine whether the power amplifier is operating in a low-power mode or a high-power mode;
 if the power amplifier is operating in the high-power mode, set the power amplifier to operate in the low-power mode, apply a first closed-loop control of the drain current while the power amplifier is operating in the low-power mode, and maintain the drain current as determined by the first closed-loop control while the processor adjusts a voltage of the input signal of the power amplifier to reach a desired power level for the output signal of the power amplifier; and
 if the power amplifier is operating in the low-power mode, apply a second closed-loop control of the drain current according to the desired power level for the output signal of the power amplifier.

16. A method comprising:

determining whether a power amplifier is operating in a low-power mode or a high-power mode, the power amplifier having an input signal, an output signal, and a drain current;

if the power amplifier is operating in the high-power mode:
 setting the power amplifier to operate in the low-power mode,
 obtaining from calibrated drain current data a first calibrated drain current value associated with a first present operational parameter of the power amplifier and a first present power level of the output signal of the power amplifier,
 determining whether a result of comparing a first present drain current value of the drain current to the first calibrated drain current value satisfies a first threshold condition,
 if the first threshold condition is not satisfied, adjusting a voltage of the input signal of the power amplifier to reach a desired power level for the output signal of the power amplifier, and
 if the first threshold condition is satisfied, adaptively controlling power of the power amplifier and adjusting the drain current based on a second calibrated drain current value associated with a second present operational parameter of the power amplifier and a second present power level of the output signal of the power amplifier; and if the power amplifier is operating in the low-power mode:
 obtaining from the calibrated drain current data a third calibrated drain current value based on a third present operational parameter of the power amplifier and a third present power level of the output signal of the power amplifier,
 determining whether a result of comparing a second present drain current value of the drain current to the third calibrated drain current value satisfies a second threshold condition, and
 if the second threshold condition is satisfied, adaptively controlling power of the power amplifier and adjusting the drain current based on a fourth calibrated drain current value associated with a fourth present operational parameter of the power amplifier and a fourth present power level of the output signal of the power amplifier.

17. The method of claim 16, further comprising if the power amplifier is operating in the low-power mode and the second threshold condition is not satisfied, repeating operations of the obtaining the third calibrated drain current value and the determining whether the result of comparing the second present drain current value of the drain current to the third calibrated drain current value satisfies the second threshold condition.

18. The method of claim 16, wherein the first, second, third, or fourth operational parameter is a frequency of the input signal of the power amplifier, a phase of the input signal of the power amplifier, a power level of the input signal of the power amplifier, or a temperature associated with the power amplifier.

19. The method of claim 16, wherein the first threshold condition is a difference between the present drain current value and the first calibrated drain current value is less than, equal to, or larger than a predetermined value.

20. The method of claim 16, wherein the second threshold condition is a difference between the present drain current value and the second calibrated drain current value is less than, equal to, or larger than a predetermined value.

21. The method of claim 16, wherein the determining whether the power amplifier is operating in the low-power mode or the high-power mode comprises determining whether a present power level of the output signal of the power amplifier is less than, equal to, or larger than a sensitivity power level that designates between the low-power mode and the high-power mode of the power amplifier.

22. The method of claim 16, wherein the setting the power amplifier to the low-power mode comprises setting a present power level of the output signal of the power amplifier to a minimum power level.

23. The method of claim 16, wherein the setting the power amplifier to the low-power mode comprises setting a present power level of the output signal of the power amplifier to be less than a sensitivity power level that designates between the low-power mode and the high-power mode of the power amplifier.

24. The method of claim 16, wherein the adjusting the voltage of the input signal of the power amplifier to reach the desired power level for the power amplifier comprises adjusting a variable voltage attenuator that assists in providing the input signal to the power amplifier.

25. The method of claim 16, wherein the power amplifier is a GaN power amplifier.

26. The method of claim 16, wherein the adjusting the drain current based on the second calibrated drain current value comprises adjusting the drain current to match or substantially match the second calibrated drain current value.

27. The method of claim 16, wherein the adjusting the drain current based on the fourth calibrated drain current value comprises adjusting the drain current to match or substantially match the fourth calibrated drain current value.

* * * * *